(12) United States Patent
Sönning et al.

(10) Patent No.: US 6,717,933 B1
(45) Date of Patent: Apr. 6, 2004

(54) CONVERTER AND METHOD FOR CONVERTING AN INPUT DATA PACKET STREAM INTO AN OUTPUT DATA SYMBOL STREAM

(75) Inventors: Raimund Sönning, Nürnberg (DE); Gian Huaman-Bollo, Nürnberg (DE)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 743 days.

(21) Appl. No.: 09/667,214

(22) Filed: Sep. 21, 2000

(30) Foreign Application Priority Data

Sep. 28, 1999 (EP) .............................. 99119010

(51) Int. Cl.$^7$ .............................. H04B 7/216
(52) U.S. Cl. ...................... 370/342; 370/441
(58) Field of Search ................ 370/204, 209, 370/310.1, 310.2, 319, 320, 335, 342, 441, 465, 479, 538

(56) References Cited

U.S. PATENT DOCUMENTS

| | | | |
|---|---|---|---|
| 5,878,045 A | * | 3/1999 | Timbs ......................... 370/466 |
| 5,896,368 A | | 4/1999 | Dahlman et al. |
| 6,366,588 B1 | * | 4/2002 | Gans et al. .................. 370/320 |
| 6,445,683 B1 | * | 9/2002 | Nobuyasu et al. ........ 370/310.1 |
| 6,567,428 B1 | * | 5/2003 | Rubin et al. ................ 370/538 |

FOREIGN PATENT DOCUMENTS

WO 98/58472 12/1998

* cited by examiner

Primary Examiner—Chi Pham
Assistant Examiner—Anh-Vu Ly
(74) Attorney, Agent, or Firm—Nixon & Vanderhye P.C.

(57) ABSTRACT

The invention relates to a converter (CVT) and a conversion method for converting an input data packet stream (IDPS) of consecutive data packets ($DP_{0,0}$, $DP_{1,0}$, $DP_{2,0}$ ... $DP_{N-1,0}$) each data packet including user ($US_0$, $US_1$, $US_2$, ... $US_{N-1}$) data in the form of a predetermined number ($Nsymbol_0$; $Nsymbol_1$; $Nsymbol_{N-1}$) of consecutive data symbols ($S_{0,0}(0)$, $S_{0,0}(1)$ ... $S_{0,0}(Nsymbol_0-1)$; $S_{1,0}(0)$, $S_{1,0}(1)$ ... $S_{0,0}(Nsymbol_0-1)$; $S_{2,0}(0)$, $S_{2,0}(1)$ ... $S_{2,0}(Nsymbol_2-1)$; ... $S_{N-1,0}(0)$, $S_{N-1,0}(1)$ ... $S_{N-1,0}(Nsymbol_{N-1}-1)$) from a plurality of N user channels (ch-0, ..., ch-N-1), each user channel having a predetermined transmission rate $TR_0$, $TR_1$, $TR_2$, ..., $TR_n$, ... $TR_{N-1}$, being defined as a basic transmission rate $TR_B$ or an integer multiple $TR_n = K_n * TR_B$ thereof, into an output data symbol stream (ODSS) in which a respective number $K_n$ of data symbols ($S_{0,0}(0)$; $S_{1,0}(0)$, $S_{1,0}(1)$, $S_{1,0}(2)$, $S_{1,0}(3)$; $S_{2,0}(0)$; ... $S_{N-1,0}(0)$, $S_{N-1,0}(1)$) of each data packet are sequentially arranged. The write means (W) writes the data symbols into a memory (M) in the row direction in a specific order and a read means (R) reads the memory (M) in the column direction. Thus, independent of the transmission rate (TRB) of the individual user channels, a CDMA-modulator (MOD) can be provided respectively with the first data symbol or a set of first data symbols from each packet within a predetermined time interval ($1/TR_B$).

25 Claims, 9 Drawing Sheets

ENC BOARD AND RELATED BOARDS IN THE BASESTATION

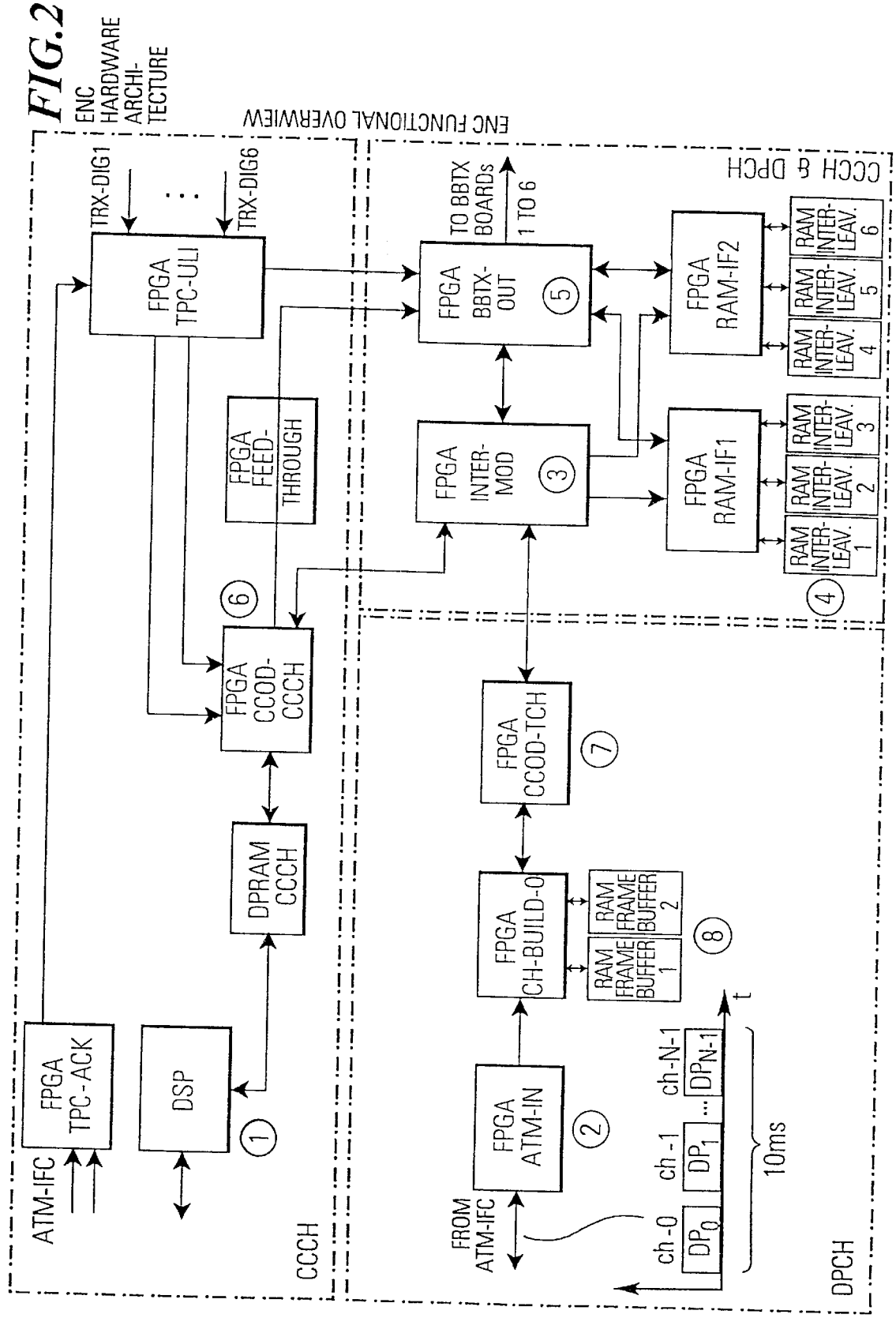
FIG.2 ENC HARDWARE ARCHITECTURE

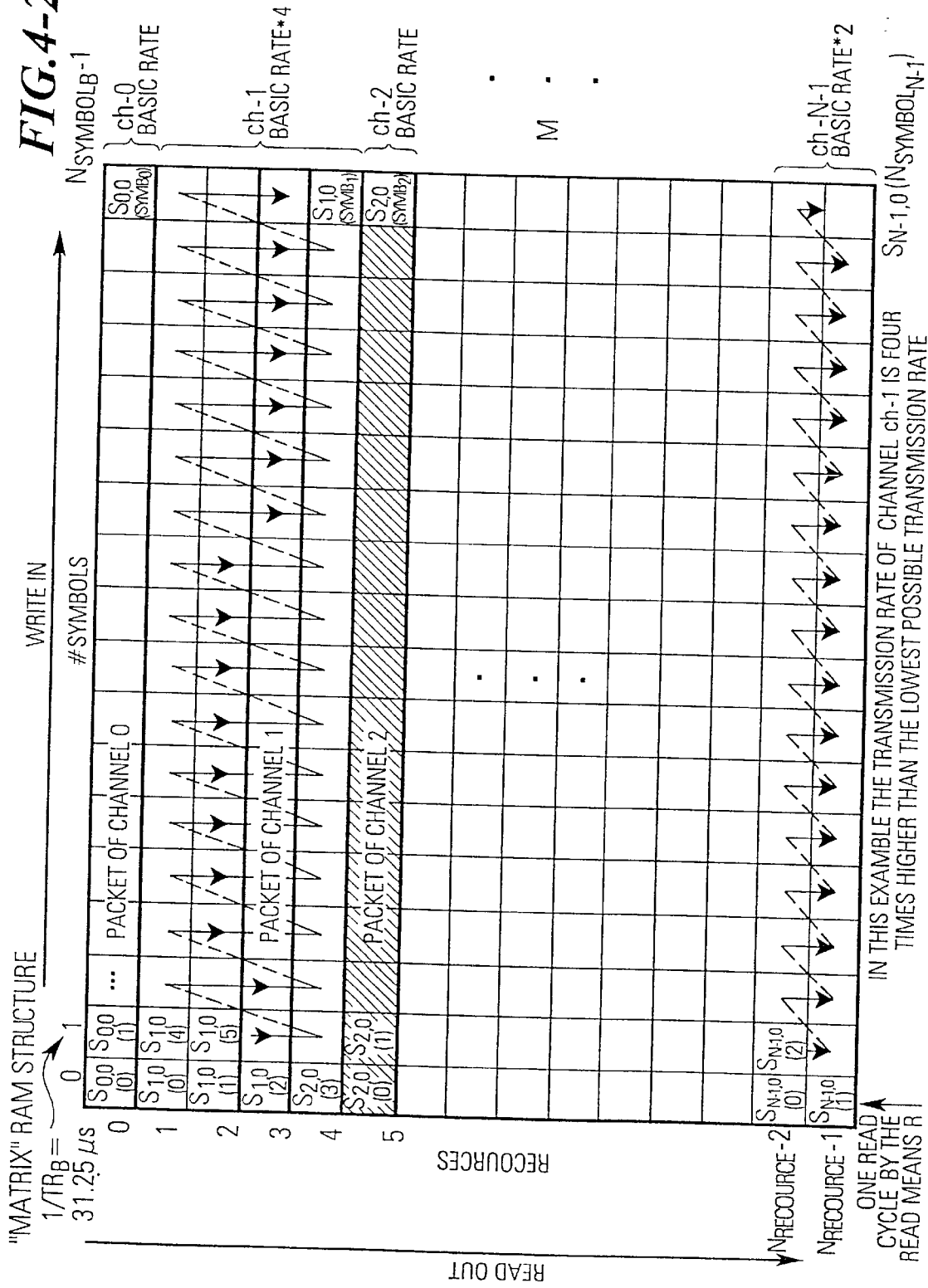

REAL RAM STRUCTURE

CONVERTER AND METHOD FOR CONVERTING AN INPUT DATA PACKET STREAM INTO AN OUTPUT DATA SYMBOL STREAM

FIELD OF THE INVENTION

The invention relates to a converter and a method for converting an input data packet stream of consecutive data packets into an output data symbol stream of data symbols. The respective data packets of the input data packet stream each include user data in the form of consecutive data symbols, wherein each of the data packets are provided by a plurality of N user channels having respectively different predetermined transmission rates. In the output data symbol stream respectively corresponding data symbols from the individual input data packets are sequentially arranged.

The invention particularly relates to an encoder of a CDMA transmitter, in which such a converter is used to provide the respective data symbols consecutively to a CDMA modulator in which the respective data symbols are convoluted with respective codes (e.g. Walsh-codes) having a length e.g. dependent on the spreading factor provided for each channel in the output data symbol stream. Although the converter can be used independently as to whether or not the data packets from the respective user channels arrive asynchronously or synchronously at the encoder, after the converter a synchronous processing (synchronous with respect to the symbol length of a symbol at the basic transmission rate in the air) of the data is required and preferably different data rates should be supported.

BACKGROUND OF THE INVENTION

Since the invention generally relates to a transmitter of a CDMA-system and in particular to the encoding, interleaving and modulating units of an encoder unit of the CDMA-system, more specifically to the problem of how a plurality of user channels each having a different transmission rate and sending user data as data packets can be combined into a data symbol stream to be processed and CDMA modulated for all channels at the same time, hereinafter, first a general overview of a base station transmitter of a CDMA-system is described with reference to FIG. 1.

In FIG. 1, ATM-IFC is an ATM interface board, ENC is the channel encoder, interleaver, QPSK selector and time alignment unit; BBTX is the CDMA modulation, spreading and combining unit, BBIF is an interface board, BBRX is the CDMA demodulator and despreader for dedicated channels, DEC is the Viterbi decoder for dedicated channels, BBPA is the random access receiver (including a decoding unit), and DC-FILT is the power supply. Asynchronously arriving data packets are input to the encoder ENC at $\hat{2}$. The TRX-DIG unit is a digital pulse shaping filter & digital/analog conversion unit.

FIG. 2 shows the encoder ENC with more details. On a plurality of channels ch-0, ch-1 ... ch-N−1 a plurality of N users input data packets $DP_0$, $DP_1$ ... $DP_{N-1}$ of variable length (due to the variable transmission rates $TR_0$, $TR_1$, ... $TR_{N-1}$) which arrive at the FPGA at $\hat{2}$ (Field Programmable Gate Array). Essentially, in the encoder ENC in FIG. 2, data for user channels and data for common control channels undergo a convolutional encoding at $\hat{6}$, $\hat{7}$ and essentially serial bit streams are input to the FPGA $\hat{3}$, which performs the interleaving, time alignment etc. Data is output to the CDMA modulator (indicated with "BBTX-board" in FIG. 2) from the FPGA $\hat{5}$. As explained below, the data of common control channels are input to the digital signal processor DSP $\hat{1}$.

As is indicated in FIG. 2, the input data of the user channels ch-0, ch-1, ... ch-N−1 arrive from the ATM-IFC unit (an asynchronous transfer mode interface unit) in data packets $DP_0$, $DP_1$, $DP_2$ ... $DP_{N-1}$ asynchronously at the first FPGA $\hat{2}$. That is, the transmission of data packets of the respective N user channels ch-0, ch-1 ... ch-N−1 takes place using an asynchronous transfer method (ATM). As is schematically indicated in FIG. 2, within each frame defined by a frame synchronization clock supplied by a main controller, one single packet of each user channel must be processed, i.e. as is shown in FIG. 2, the user data packets $DP_0$, $DP_1$, $DP_2$, ... $DP_{N-1}$ arriving asynchronously must be processed in a standard frame period of for example T=10 ms.

In FIG. 2, the DSP at $\hat{1}$ is a digital signal processor which receives configuration data and data packets for the common control channels, configures FGPAs and processes common control channels to the FPGA $\hat{6}$. The ATM packets for dedicated physical channels (DPCH) (=user traffic data) are input to the FPGA $\hat{2}$ as explained above. The FPGA $\hat{3}$ is essentially a write means for the interleaver and converter (and the time alignment). $\hat{4}$ is a memory means for the interleaver and converter (and the time alignment). $\hat{5}$ is a read means for the interleaver and converter (and time alignment) for providing an output symbol stream to the CDMA modulator. $\hat{6}$ is a convolutional encoder for common control channels. $\hat{7}$ is a convolutional encoder for dedicated physical channels. $\hat{8}$ is a unit for performing a frame buffering for dedicated physical channels. In the unit $\hat{8}$ some synchronisation of the incoming asynchronous input data bit stream is performed if more than one packet arrives for a single channel within the predetermined frame period. This synchronisation ensures that after the unit $\hat{8}$ only one respective single packet of all channels is processed within the frame period.

DESCRIPTION OF THE RELATED ART

On the basis of the above explanations with respect to FIG. 1 and FIG. 2, FIG. 3-1 shows a principle block diagram of an encoder ENC to illustrate the underlying problem of the invention. In principle, the blocks indicated in FIG. 2 are also present inherently in FIG. 2. FIG. 3-2 shows the processing of data packets from the input to the output of the encoder board in several consecutive frames m, m+1, m+2.

As shown in FIG. 3-1, there are a plurality of users $US_0$, $US_1$ ... $US_{N-1}$ transmitting data packets DP on respective user channels ch-0, ch-1 ... ch-N−1. As shown with the time line at 10 ms, 20 ms, 30 ms on the left side in FIG. 3-1 it should be understood that actually the packets DP arrive asynchronously at the encoder ENC. Within each frame interval of e.g. 10 ms one data packet of each channel arrives asynchronously.

As mentioned above, if more than one data packet arrives for a channel within the frame interval then the unit $\hat{8}$ synchronizes i.e. processes these packets in such a way that only one packet per frame interval and channel is input to a parallel/serial converter P/S and thus to the convolutional encoder CC (unit $\hat{7}$ in FIG. 2). Hereinafter, it is assumed that always one packet arrives asynchronously per channel and frame interval, either because indeed only one packet arrives or because several packets have been processed in the correct manner by the unit $\hat{8}$. The parallel/serial converter P/S shown in FIG. 3-1 is preferably arranged between the units $\hat{8}$ and $\hat{7}$ in FIG. 2, i.e. before the convolutional encoder CC as shown in FIG. 3-1. However, completely independent of the location and structure of the parallel/serial converter P/S and the structure of the units $\hat{2}$, $\hat{3}$, the important aspect is that the convolutional encoder CC (unit 7 in FIG. 2) receives a serial data bit stream SDBS comprising a single packet of each channel per frame interval. For example, if the units 2, 8, are already provided with said serial data bit stream SDBS, then the parallel/serial converter is not necessary. Thus, the P/S converter is only one of several possibilities to generate the serial data bit stream (as indicated with the dotted line for the encoder ENC in FIG. 3-1).

As is also shown in FIG. 3-1, each user channel ch-0, ch-1, ch-N−1 has a specific transmission rate $TR_0$, $TR_1$, . . . $TR_{N-1}$. The transmission rate TR of the physical channels relates to the time duration of one symbol on the air interface. Thus, dependent on the transmission rate, the data packets DP respectively comprise a corresponding number of bits according to the physical channel to which they are mapped. For example the slowest channel (having a basic transmission rate) considered in the system may comprise 11 byte per data packet (e.g. for a normal speech channel) or 90 byte per data packet (e.g. for an unrestricted data service like a 64 k bit/s ISDN channel). Therefore, as is schematically illustrated in FIG. 3-1, in fact the asynchronously arriving data packets DP each have a different length; that is, the respective transmission of user data in each channel takes place at different transmission rates (in data bursts). However, within each channel the data packets have—due to the constant transmission rate—a constant length, but arrive asynchronously.

A parallel/serial converter P/S (which is situated outside the base station and which is thus not a part of the encoder) converts a single packet of each channel asynchronously arriving within each frame interval into a serial data bit stream SDBS such that the bits of all the single packets of all channels arriving asynchronously within a single frame interval are now serially arranged within the frame period. That is, while the base station e.g. the unit 8 ensures that only one packet arrives per channel within the frame interval, the converter P/S arranges their bits serially as shown in FIG. 3-1. In FIG. 3-1, $DP_{0,0}$, $DP_{1,0}$, $DP_{2,0}$ . . . $DP_{N-1,0}$ designate the respective 1-st data packets of channels ch-0, ch-1, ch-2, . . . ch-N−1. Likewise, in the next frame period of 10 ms the data packets $DP_{0,1}$, $DP_{1,1}$, $DP_{2,1}$ . . . $DP_{N-1,1}$ designate the 2-nd data packets of the user channels, which are again sequentially arranged. Whilst the packets arrive asynchronously at the P/S converter, the serial data bit stream SDBS contains all data packets of all channels within a single frame period (sequentially arranged). Thus, the serial data bit stream SDBS contains consecutively arranged data bits from the individual user channels due to the sequential arranging of the data packets.

A convolutional encoder CC known per se in the art performs a convolutional encoding on each bit of the data bit stream SDBS with a predetermined coding rate 1/r and constraint length l. Basically, the convolutional encoder CC outputs r bits for each input bit from the input data packet stream IDPS. Consequently, the output bit stream CCBS from the convolutional encoder CC is 1/r times as long as the serial input data bit stream SDBS (more specifically 1/r times longer as the serial data bit stream SDBS). Typical values for r are r=½ or r=⅓.

The serial bit stream CCBS of increased length output by the convolutional encoder CC is interleaved in an interleaver IL also known as such in the art. Essentially, the sequential bit stream CCBS is written into an interleaving matrix in a horizontal direction and the bits are read out again from the interleaving matrix in a vertical direction. Each packet is interleaved separately and the size of the matrix is always chosen such that all bits of one packet from one channel can be accommodated therein. That is, the respective interleaver matrices are determined, filled, and read out separately for each packet, i.e. N-times during a time interval of e.g. T=10 ms.

The matrices are adapted to the number of bits per packet (which is dependent on the transmission rate), i.e. for each transmission rate there exists a special interleaving matrix. If two channels have equal transmission rate, then they are also interleaved in the same manner.

The output ICBS of the interleaver IL is an interleaved bit stream which is then input to a QPSK modulator. Since the input to the QPSK modulator is a bit stream, the modulator operates as a kind of I, Q selector to select e.g. I, Q bits from the bit stream ICBS (the actual QPSK modulation takes place in the analogue world). This QPSK selection process is necessary, since essentially the CDMA modulator MOD performs a complex convolution (bitwise) on I, Q bits. That is, the QPSK selector/modulator outputs in fact data symbols I, Q as pairs to the CDMA modulator to undergo the CDMA modulation. A QPSK modulator known as such in the art can for example assign a first bit of the interleaved bit stream ICBS to be a I-bit, a second bit to be a Q-bit, the third bit to be a I-bit and so on. Furthermore, it should be noted that the QPSK modulator can output the I, Q bits respectively serially or parallely. That is, the QPSK modulator may output two separate bit streams in parallel each containing the I, Q bits respectively.

Whilst the input channels ch-0, ch-1, . . . ch-N−1 can be viewed by the mobile radio network as "logical channels", the input data symbol stream ODSS input to the CDMA modulator MOD and containing the sequential data symbols can be regarded as "physical channels", as indicated in FIG. 3-1. Furthermore, regarding the input to the CDMA modulator, it is in fact irrelevant how the data symbol stream ODSS is obtained, since the CDMA modulator will merely take the individual data symbols to perform the CDMA modulation on them individually. That is, different convolutional encoding schemes or interleaving schemes may be used in the encoder CC and in the interleaver IL or even in the QPSK modulator (the QPSK selector) without any loss of generality. The important issue is, that the CDMA modulator is provided with a data symbol stream ODSS consisting of complex symbols having a real part I and an imaginary part Q, since in the CDMA modulator a complex convolution is performed. Thus, it is irrelevant whether the complex symbol is obtained via a QPSK (QPSK: Quadrature Phase Shift Keying) or via a 16-QAM modulation (selection). Whilst the data bit stream SDBS input to the convolutional encoder CC is packet oriented, the bit streams CCBS, ICBS input to the and output from the interleaver IL are bit-orientated (but still in packets) and the data symbol stream ODSS from the QPSK modulator is data symbol oriented. Therefore, a data symbol rate of the physical channel can for example be 32 ksps, 64 ksps, or 128 ksps (ksps: kilo symbols per second) whilst the logical channels may have a bit rate of e.g. 9.6 kbit/s, 64 kbit/s or 384 kbit/s. Essentially, the symbol rate is adapted to the requirements of the CDMA modulator and the input data rates have to be converted to the physical channel symbol rate by a channel encoding and rate matching process.

FIG. 3-2 summarizes the processing of the data packets in a frame-wise consideration. While in frame m the data packets are input serially to the encoder, in frame m+1 the data packets are serially processed and in frame m+2 the processed data packets having time offsets to each other and with respect to the common (frame) synchronization signal are output in parallel to the CDMA modulator.

SUMMARY OF THE INVENTION

Since the CDMA modulator MOD can not handle the user data for one channel in packet form, a convolutional encoding, interleaving and QPSK modulation must provide the user data symbolwise to the CDMA-modulator unit MOD with the respective symbols of all channels which need to be combined at the CDMA modulator output.

Even if only user channels of the same transmission rate are to be handled, the encoder ENC having a structure as shown in FIG. 3-1 requires a conversion, because due to the serial processing of the packets always—i.e. independent of the rate—first all symbols of the first user, then all symbols of the second user, . . . , and finally all symbols of the N-th user arrive sequentially. However, the CDMA modulator MOD requires for its processing at first the first symbols of all packets (i.e. the first symbol from channel ch-0, the first symbol of channel ch-1, . . . the first symbol of channel ch-N−1), then the second symbols of all packets, . . . etc. in a sequential order, i.e. the CDMA modulator requires to be provided with the symbols that need to be combined at the CDMA modulator output at the same time. Due to interface limitations, these symbols (to be combined) themselves are transmitted serially from the encoder ENC to the CDMA modulator.

Moreover, if the kind of system in FIG. 3-1 is to be used for respective user channels having different transmission rates, the data symbol stream ODSS may also contain—despite the different transmission rates—one data symbol of the first channel, four symbols of a second channel and two symbols of a third channel, if the first channel has a basic transmission rate, the second channel has four times the basic transmission rate and the third channel has twice the basic transmission rate.

TABLE 1

| Symbol 1 | Symbol 1 | Symbol 1 | Symbol 1 | Symbol 2 | $TR_B$ |
|---|---|---|---|---|---|
| Symbol 1 | Symbol 2 | Symbol 3 | Symbol 4 | Symbol 1 | $4*TR_B$ |
| Symbol 1 | Symbol 1 | Symbol 2 | Symbol 2 | Symbol 3 | $2*TR_B$ |
| | | $1/TR_B$ | | | |

That is, as shown in the above table 1 (showing the sequence of symbols for 3 different channels in one period $1/TR_B$) with respect to one time interval $1/TR_B$ ($TR_B$: basic transmission rate of the slowest channel), at least one symbol of each channel is provided. Transmitted are only the bold-faced symbols, which the CDMA modulator MOD will then repeat. This process essentially performs a prespreading to the highest possible symbol rate in the system. As explained above, the CDMA modulator MOD needs at the same time all corresponding symbols, which are to be combined in the next interval of $1/TR_B$.

Therefore, a first object of the invention is to provide a converter and a conversion method, which allow to convert the asynchronously arriving data packets into a data symbol stream, which provides in a predetermined time interval, i.e. in the duration of a symbol of the lowest symbol rate on the air interface, one or more symbols for all channels to the CDMA modulator to be spreaded, weighted and combined within this interval.

A second object of the invention is to provide a converter and a method for providing such a data symbol stream when the input user channels have mutually different transmission rates.

Solution of the Object

The above objects are solved according to claim 1 by a converter for converting an input data packet stream of consecutive data packets each data packet including user data in the form of a predetermined number consecutive data symbols, from a plurality of N user channels, each user channel having a predetermined transmission rate $TR_0$, $TR_1$, $TR_2$, . . . , $TR_n$, . . . , $TR_{N-1}$, being defined as a basic transmission rate $TR_B$ or an integer multiple $TR_n=K_n*TR_B$ thereof, into an output data symbol stream in which a respective number $K_n$ of data symbols of each data packet are sequentially arranged, comprising a memory means having a number of columns and a number of rows, a write means for writing the data symbols of said consecutive data packets into said memory means, such that the data symbols of a data packet having the basic transmission rate $TR_B$ are consecutively arranged in one row and the data symbols of data packets having an integer multiple $TR_n=K_n*TR_B$ of the basic transmission rate $TR_B$ are arranged consecutively as sets of $K_n$ consecutive data symbols in respective column portions of $K_n$ rows, and a read means for providing said output data symbol stream by reading said data symbols from the memory means sequentially in the column direction, whereby whenever all $TR_0/TR_B+TR_1/TR_B+ \ldots +TR_n/TR_B+ \ldots TR_{N-1}/TR_B=K_0+K_1 \ldots +K_n \ldots +K_{N-1}$ data symbols of one column are read out in a time interval of $1/TR_B$, the reading is continued in the next column at the first row position.

Furthermore, the above objects are solved according to claim 11 by a method for converting an input data packet stream of consecutive data packets each data packet including user data in the form of a predetermined number consecutive data symbols, from a plurality of N user channels, each user channel having a predetermined transmission rate $TR_0$, $TR_1$, $TR_2$, . . . , $TR_n$, . . . , $TR_{N-1}$, being defined as a basic transmission rate $TR_B$ or an integer multiple $TR_n=K_n*TR_B$ thereof, into an output data symbol stream in which a respective number $K_n$ of data symbols of each data packet are sequentially arranged, comprising the steps of providing a memory means having a number of columns, writing the data symbols of said consecutive data packets into said memory means, such that the data symbols of a data packet having the basic transmission rate $TR_B$ are consecutively arranged in one row and the data symbols of data packets having an integer multiple $TR_n=K_n*TR_B$ of the basic transmission rate are arranged consecutively as sets of $K_n$ consecutive data symbols in respective column portions of $K_n$ rows, and reading said data symbols from the memory means sequentially in the column direction, whereby whenever all $TR_0/TR_B+TR_1/TR_B+ \ldots +TR_n/TR_B+ \ldots TR_{N-1}/TR_B=K_0+K_1 \ldots +K_n \ldots +K_{N-1}$ data symbols of one column have been read out in a time interval of $1/TR_B$, the reading is continued in the next column at the first row position, in order to provide said output data symbol stream.

According to one aspect of the invention the converter contains a memory means having a predetermined number of columns and rows and a write means writing the data packets (consisting of sequentially arranged data symbols) into the memory such that the data symbols of the packet from the user channel having the lowest basic transmission rate $TR_B$ will occupy one row in the memory. If more data symbols of a packet from a user channel having an integer multiple $TR_n=K_n*TR_B$ of the basic transmission rate are to be stored, the data symbols of such a packet are also written in the row direction, however, this being done over a plurality of $K_n$ rows. The writing in of the sequential data symbols of the packet from the higher transmission rate channel is performed in such a way, that the data symbols are consecutively ordered in the column direction. A read means reads out the memory in the column direction and—since the data symbols of packet having higher user rates are sequentially arranged in the column direction—the read out in the column direction will provide the desired output data symbol stream, in which the respective number of data symbols for each packet are sequentially arranged.

This object is also solved by a converter according to claims 19, 20 and 21 and by a method according to claims 22–25.

PREFERRED EMBODIMENTS AND IMPROVEMENTS OF THE INVENTION

According to another aspect of the invention, the write means performs the writing in dependent on a clock signal which indicates the switching to a new row dependent on the number of data symbols contained in each packet for each channel. Therefore, each row in the memory can be assigned to a particular channel and—since the transmission rate per channel is constant—the same data symbols are always written into the same rows.

According to another aspect of the invention, the read out means performs the reading out in the column direction depending on a second clock signal which indicates when the reading out should be stopped in one column and should be continued in the next column. Preferably, the second clock signal is determined by the internal timing of the CDMA modulator. Preferably the second clock is the duration of a symbol of the lowest rate in the air (e.g. $1/TR_B$= 1/32 KHz≈31 s). That is, since the CDMA modulator aims at parallely coding all corresponding data symbols of all data packets at a certain timing (after sequentially reading out the data symbol in the column direction from the memory), the CDMA modulator comprises, because of the parallel processing, for each physical channel a separate CDMA modulator unit which then picks out the respective data symbols for each channel from the data symbol stream.

According to another aspect of the invention, the converter according to the invention, when being used in an encoder ENC of a CDMA transmitter, performs the function of the interleaving and the QPSK modulation simultaneously with the conversion of the input stream to the output stream. In this case, the data symbols are stored symbol-wise at each entry in the memory of the converter, wherein the respective bits forming one data symbol are selected from the bit stream output by the convolutional encoder. The writing into the memory of the converter and the reading from the memory of the converter is performed such that the interleaving is achieved at the same time.

Further advantageous embodiments and improvements of the invention are listed in the dependent claims. Hereinafter, the invention will be described with reference to its embodiments and by referring to the attached drawings.

BRIEF DESCRIPTION OF THE DRAWINGS

FIG. 2 is an overview of the encoder ENC in FIG. 1;

FIG. 3-1 shows a block diagram of the units of the encoder ENC relevant for the present invention;

FIG. 3-2 shows the processing of data packets from the input to the output of the encoder board in several consecutive frames m, m+1, m+2 according to the invention;

FIG. 4-1 shows an embodiment of a converter CVT according to the invention;

FIG. 4-2 shows the contents of the memory M of the converter CVT in FIG. 4-1;

FIG. 6-1 shows a conventional interleaving matrix for interleaving a data packet of a basic transmission rate;

FIG. 6-2 shows a conventional interleaving matrix for interleaving a data packet of a transmission rate $4*TR_B$;

FIG. 6-3 shows the combined interleaving/conversion process according to an embodiment of the invention;

FIG. 6-4a shows a conventional interleaving matrix with interleaving depth 32 for the case of $4*TR_B$;

FIG. 6-4b shows the corresponding entries in the converter matrix, similar as in FIG. 6-3;

In the drawings the same or similar reference numerals describe the same or similar parts. Hereinafter, with reference to FIG. 4-1, FIG. 4-2, a first embodiment of the invention will be described.

First Embodiment (Conversion)

Figure 1:
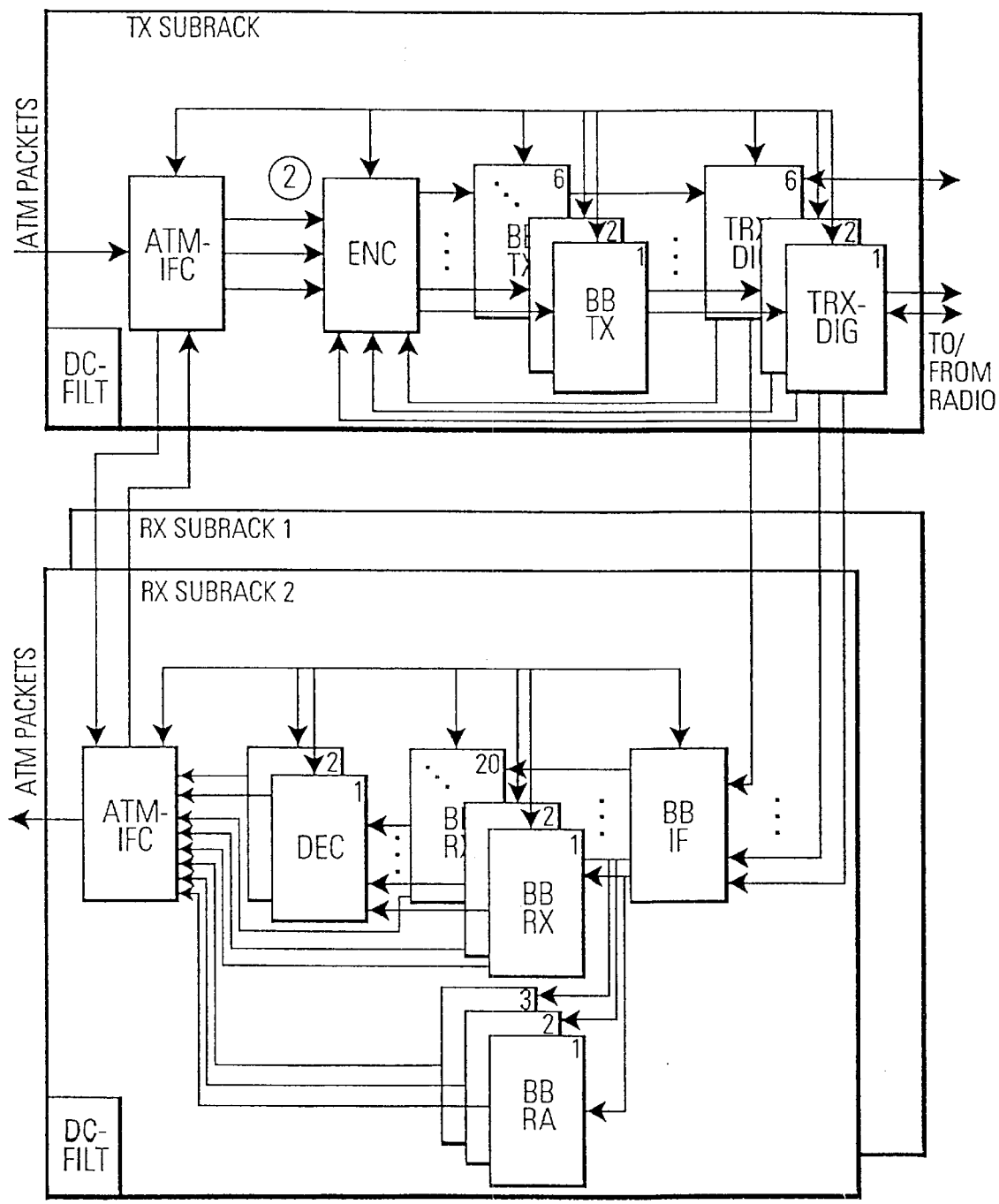
FIG. 1 is an overview of a CDMA-system.
Figures 1, 4:
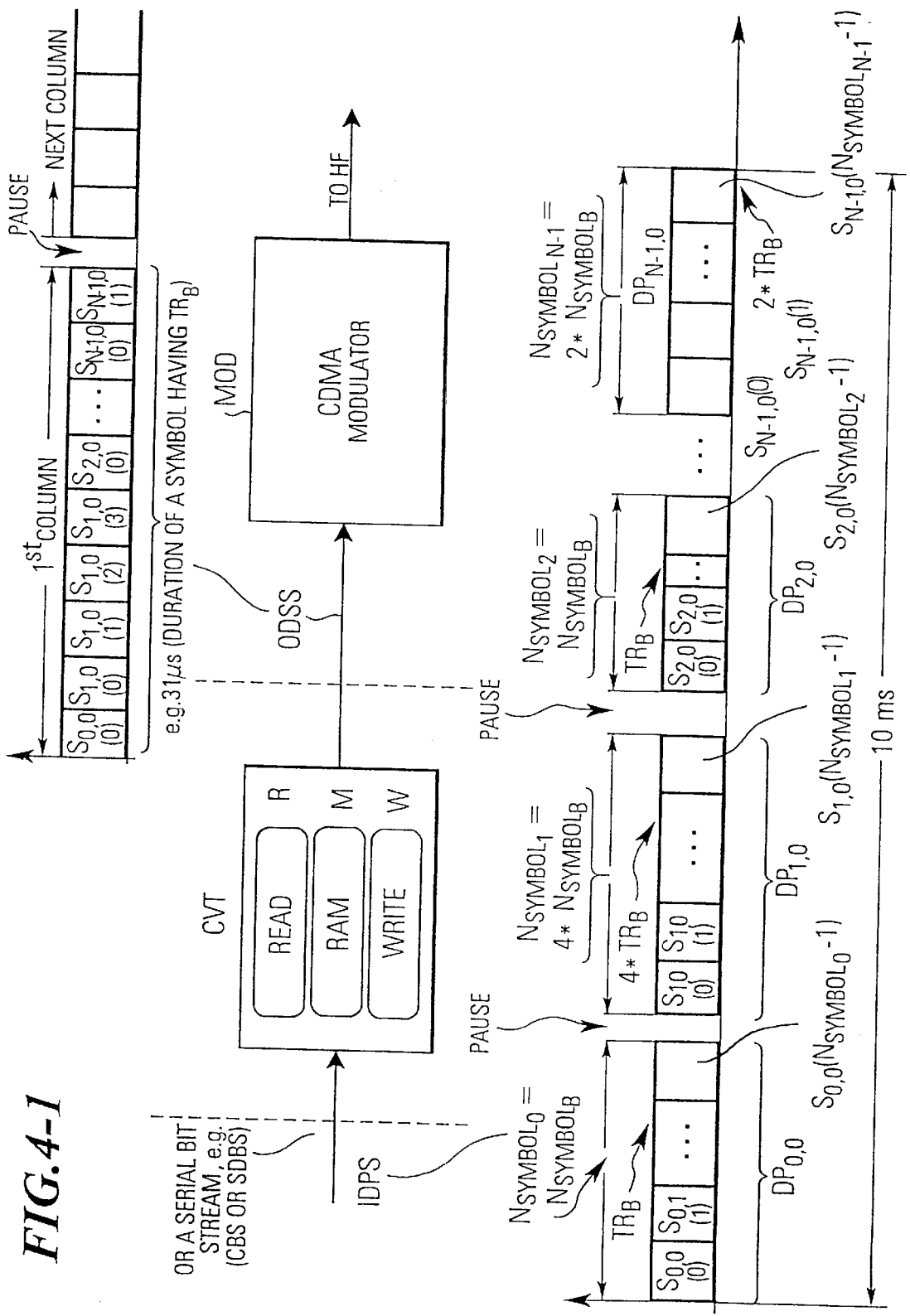

FIG. 4-1 shows a converter CVT according to the invention which provides an output data symbol stream ODSS to a CDMA modulator MOD. The CDMA modulator performs the spreading and the CDMA modulation on the data symbols contained in the output data symbol stream ODSS and provides the modulated and combined output to a HF part of a transmitter, which is of no further relevance in the present invention. Furthermore, it should be noted that in the CDMA modulator all channels are added, i.e. more specifically, the spread symbols are added.

Figures 1, 3:
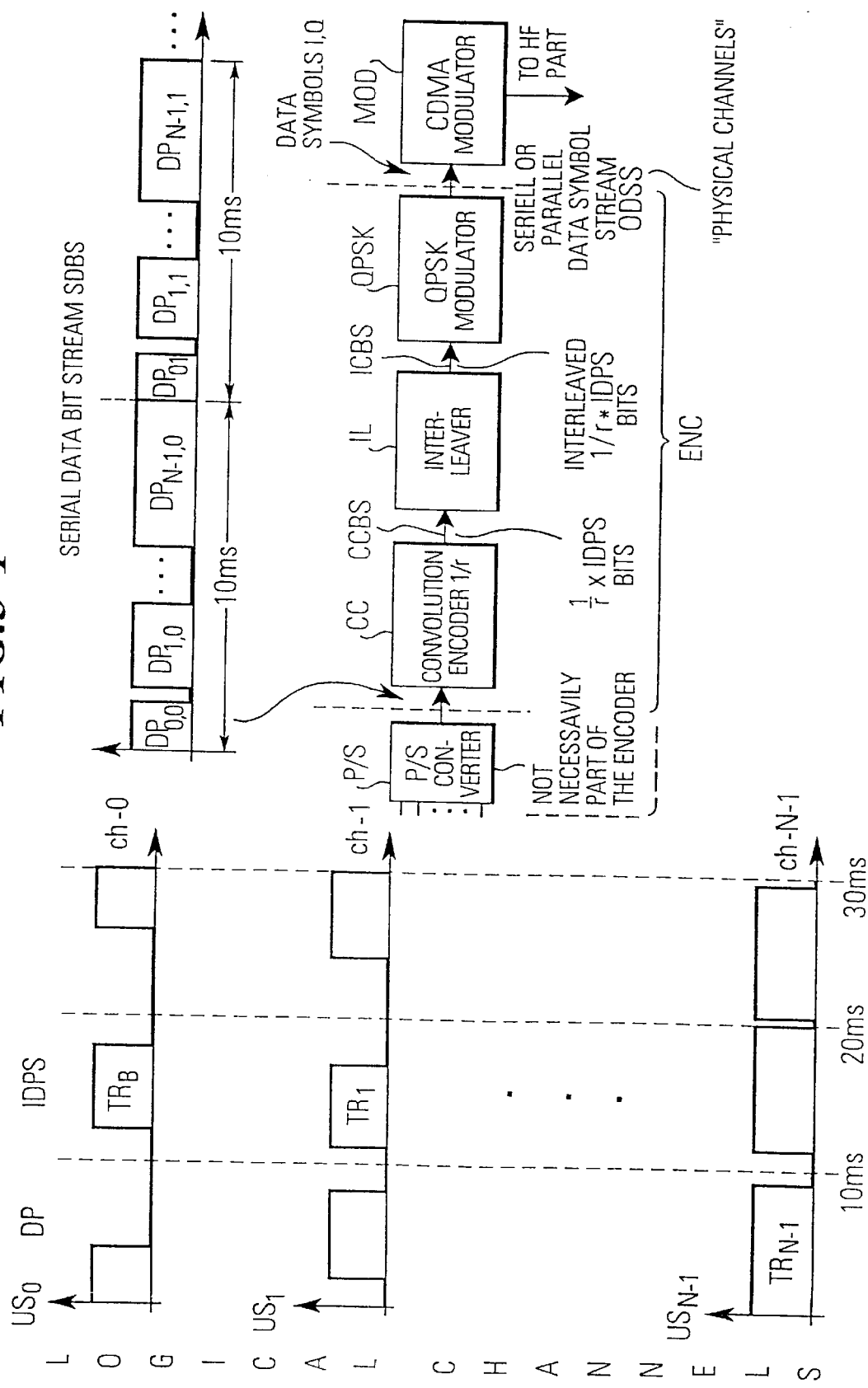

As is also seen in FIG. 4-1, the converter CVT receives an input data packet stream IDPS, for example the data packet stream ODSS output from the QPSK modulator (I, Q selector) QPSK in FIG. 3-1. That is, according to a first embodiment the converter CVT is arranged between the QPSK modulator QPSK (i.e. the I, Q selector) and the CDMA modulator MOD.

In the embodiment in FIG. 4-1 the input data packet stream IDPS is a sequence of data packets $DP_{0,0}$, $DP_{1,0}$, $DP_{2,0}$ ... $DP_{N-1,0}$ wherein each data packet includes user data from users $US_0$, $US_1$, $US_2$, ... $US_{N-1}$ in the form of a predetermined number $Nsymbol_0$ (which in the example of FIG. 4-1 equals $Nsymbol_B$, which is the number of symbols for a channel having the basic transmission rate), $Nsymbol_1$, $Nsymbol_2$ ... $Nsymbol_{N-1}$ of consecutive data symbols $S_{0,0}(0)$, $S_{0,0}(1)$ ... $S_{0,0}(Nsymbol_0-1)$; $S_{1,0}(0)$, $S_{1,0}(1)$ ... $S_{1,0}(Nsymbol_1-1)$; $S_{2,0}(0)$, $S_{2,0}(1)$ ... $S_{2,0}(Nsymbol_2-1)$; ... $S_{N-1,0}(0)$, $S_{N-1,0}(1)$ ... $S_{N-1,0}(Nsymbol_{N-1}-1)$. The respective packets belong to a plurality of N user channels ch-0, ch-1, ch-2, ... ch-N-1.

As indicated in FIG. 4-1, due to the different transmission rates $TR_n$ of the symbols on the air interface each packet is respectively $Nsymbols_n$ long. Although the transmission rate does not directly indicate the length of the packet, the length of a packet is dependent on the transmission rate as shown in the following example. If the transmisson rate is e.g. $TR_1$=32 ksps then the length $L_1$ of a packet is $L_1$=32 Ksymbols/s*10 ms=320 symbols or 640 bit (for QPSK). This value is of course the value after the encoding in the channel encoder CC. Using a rate r=⅓ in the channel encoder CC this of course means that the input packet to the encoder ENC has to be 213.3 bits long. Since this is no integer number a so-called rate-matcher is provided after the channel encoder CC. The rate-matcher adapts the output bit number from the channel encoder CC to the required number of bits in the physical channel. Therefore, whilst the transmission rate is one of the factors determining the length of a packet, the rate-matcher can perform an adaption to any desired number of bits. However, the rate matcher operates in the same manner for all channels and adopts the encoded bit stream with a predetermined number of bits corresponding to the packets at the input to the next available transmission rate of the physical channels. The number of bits can hereby be either decreased or increased.

As shown in FIG. 4-1, each user channel has a predetermined transmission rate assigned to it, namely $TR_0$, $TR_1$, $TR_2$, ... $TR_{N-1}$ as was explained with reference to FIG. 3-1. That is, each of the predetermined transmission rates is defined as a basic transmission rate $TR_B$ or an integer multiple $TR_n = K_n * TR_B$ thereof. The basic transmission rate $TR_B$ defines the time needed for the processing of $Nsymbol_B$ symbols (of a packet of the channel having the basic rate). In other words it can be seen as a definition of the spreading factor of the respective channel. Generally, the transmission rate $TR_B$ can only be $2*TR_B$, $4*TR_B$, $8*TR_B$ etc. (i.e. $K_n = 2^0, 2^1, 2^2, 2^3, \ldots$ with $K_n = TR_n/TR_B$; $TR_n$: transmission rate for channel n).

Each data symbol, e.g. $S_{0,0}(0)$, $S_0$, $(1)$ ... $S_{0,0}$, ($Nsymbol_0-1$) comprises a predetermined number of bits due to the modulation scheme used in the modulator QPSK. For a quadrature phase shift keying QPSK, each data symbol comprises 2 bits, namely an I bit and a Q bit.

When in the case of FIG. 4-1, the input data packet stream IDPS has the shown configuration of consecutive data packets DP, a write means W writes the data symbols S in a predetermined order (to be explained below) into a memory M (RAM) and a read means R reads the symbols again in a predetermined order from the memory M in order to provide the output data symbol stream ODSS, as illustrated in FIG. 4-1. Although not shown in FIG. 4-1, the memory M comprises two separate memories RAM 1 and RAM 2, one for reading and one for writing within each frame period. The function of the memories is always exchanged from frame period to frame period. Hereinafter, even if not explicitly mentioned, it is always assumed that the writing of the data is carried out to the one memory RAM 1 while a reading of data is performed from another memory RAM 2 which has been written in a previous frame period as follows:

|       | Frame n | n + 1 | n + 2 | n + 3 |
|-------|---------|-------|-------|-------|
| RAM 1 | READ    | WRITE | READ  | WRITE |
| RAM 2 | WRITE   | READ  | WRITE | READ  |
|       | 10 ms   | 20 ms | 30 ms | 40 ms |

In the first embodiment, it is in fact not relevant how the input data packet stream IDPS comprising the consecutive data symbols is generated, since the converter's main task is to convert the input stream IDPS of data symbols into the specific output data symbol stream ODSS. Therefore, the main aspect of the converter CVT according to the invention is how the conversion is being done with respect to the memory M, whilst other generation methods for the input data packet stream IDPS can also be used.

Thus, the input data packet stream IDPS may also be viewed just as a data bit stream of consecutive bits arranged in a predetermined order, for example it could be the already convolutionally encoded input data bit stream CCBS as shown in FIG. 3-1. In this case, the converter CVT, more specifically its write means W, first performs the QPSK modulation, i.e. the assigning or selection of I, Q bits of the bit stream (in order to form the data symbols only then) and then writes the selected data symbols into a specific order into the memory M, in which case the memory M will simultaneously act as an interleaving memory, normally provided in the preceding interleaver IL as shown in FIG. 3-1. It is seen, that in this case the QPSK modulation would be performed before the interleaver IL, as will be explained below with more detail in the second embodiment.

As explained, in the first embodiment it is assumed that the input data packet stream IDPS is already arranged with the predetermined number of consecutive data symbols as shown in FIG. 4-1. Due to the different transmission rates $TR_n$, in FIG. 4-1 there are shown four data packets $DPO_{0,0}$, $DP_{1,0}$, $DP_{2,0}$ ... $DP_{N-1,0}$ each comprising a predetermined number of symbols $Nsymbol_0$, $Nsymbol_1$, $Nsymbol_2$ ... $Nsymbol_{N-1}$ due to the different transmission rate. It is assumed that the first channel ch-0 has the basic transmission rate $TR_B$, the second channel ch-1 has four times the basic transmission rate $4*TR_B$, the third channel ch-2 has the basic transmission rate $TR_B$ and the N−1-th channel ch-N−1 has twice the basic transmission rate $2*TR_B$. If for example the first channel ch-0 has $Nsymbol_0 = Nsymbol_B = 320$ data symbols, then a packet of the third channel ch-2 will have $Nsymbol_2 = 320$ symbols and the second channel ch-1 and the N−1-th channel ch-N−1 will contain $Nsymbol_1 = 1280$ data symbols and $Nsymbol_{N-1} = 640$ data symbols, respectively.

In FIG. 4-1 only one frame of 10 ms is illustrated for the input data packet stream IDPS, here the first packets of each channel which arrive asynchronously. It should of course be understood that each frame of packets $DPO_{0,0}$, $DP_{1,0}$, $DP_{2,0}$ ... $DP_{N-1,0}$ will be followed by a frame having a similar arrangement of data packets. That is, the sequential order will be maintained, however, the number of data packets will depend on the number of users present in each frame. If a user is switched off and no other user is added instead, the number of packets will decrease.

Each frame contains a data packet from each user channel in one frame period. Although within each frame the position of a particular data packet from a particular user channel may change, preferably the data packets from each user channel are assigned to a fixed slot position within the frame. In FIG. 4-1 it is assumed that the data packets are consecutively arranged with increasing user channel number.

The output data symbol sequence ODSS shown in FIG. 4-1 contains a consecutive order of data symbols, which is, however, different to the input order. In particular, the output data symbol sequence ODSS is arranged such that a first symbol from the first channel $S_{0,0}(0)$ is followed by four first data symbols $S_{1,0}(0)$, $S_{1,0}(1)$, $S_{1,0}(2)$, $S_{1,0}(3)$ of the second user channel ch-1 which is again followed by a first data symbol $S_{2,0}(0)$ of the third channel ch-2. This is carried on until two first symbols $S_{N-1,0}(0)$, $S_{N-1,0}(1)$ from the packet $DP_{N-1, 0}$ are read out during a first read out cycle from the read means R (these symbols are denoted in FIG. 4-1 as "1-st column" and correspond to the elements in the first column in FIG. 4-2).

The number of consecutive data symbols per channel is determined by the transmission rate. For example, the first channel ch-0 has the basic transmission rate and therefore only one data symbol is contained during the first read out cycle. Since the second user channel ch-1 has four times the basic transmission rate $TR_B$, four data symbols of the packet $DP_{10}$ are contained next in the output data symbol stream ODSS. This is followed respectively by one data symbol of the data packet $DP_{20}$ . . . and two consecutive data symbols of the packet $DP_{N-1,0}$. As explained, this is necessary since in principle the CDMA modulator, independent as to whether the individual group of bits are supplied sequentially or parallely from the converter CVT, parallely performs a spreading and modulation on the respective first or first group of bits from each channel or, more specifically, from each packet.

Thus, in the output data symbol sequence ODSS corresponding (i.e. a number $K_n$ determined by the transmission rate) data symbols of the data packets are sequentially arranged, i.e. from all packets present in one frame ($DP_{0,0}$, $DP_{1,0}$, $DP_{2,0}$ . . . $DP_{N-1,0}$) data sets of respectively $K_n$ data symbols from the respective data packets are sequentially arranged such that the CDMA modulator is always provided with the appropriate number of symbols from the packets as determined by the transmission rate.

Figures 2, 3:
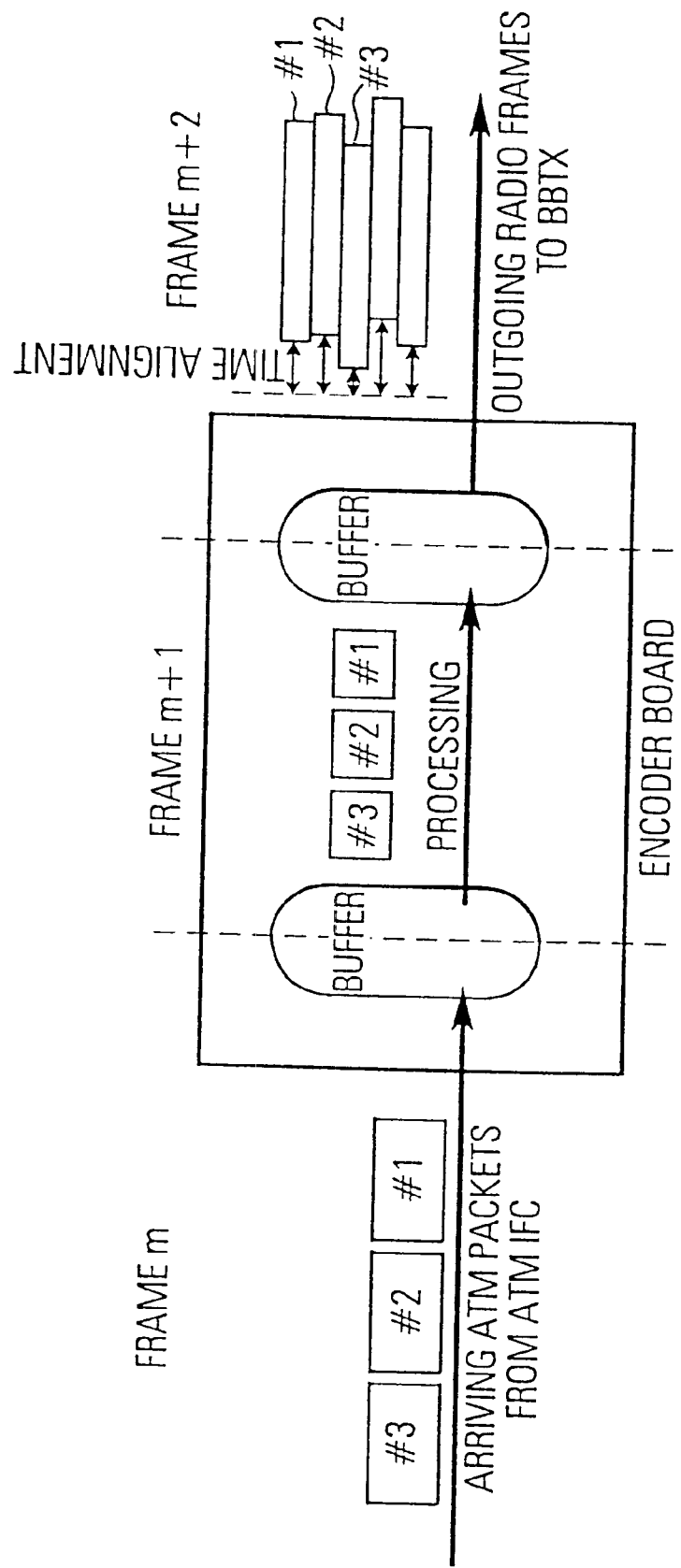

FIG. 4-2 shows how the write means W and the read means R perform the writing and reading to and from the memory M. As is shown in FIG. 4-2, the memory M has a number of columns denoted 0 . . . $Nsymbol_B-1$ (i.e. in total $Nsymbol_B$ columns, which is the number of symbols for a data packet of channel having the basic transmission rate) and a number of rows denoted 0 . . . $N_{resource}-1$ (i.e. in total $N_{resource}$ rows).

In the example in FIG. 4-2, the channel ch-1 is assigned to the first resource (row) 0, the channel ch-1 (of four times the basic rate) is assigned to the rows 1–4, the channel ch-2 (having the basic rate) is assigned to the resource 5 . . . and the channel ch-N–1 (having twice the basic rate) is assigned to the rows denoted $N_{resource}-1$ and $N_{resource}-2$. Indicated in each memory location of the memory M is the storage of the respective data symbols $S_{x,y}(z)$ shown in FIG. 4-1, wherein 'x' denotes the user or channel number, 'y' denotes the frame number and 'z' denotes the number of the symbol in the packet. minimum number of columns of the memory M is determined by the number of symbols $Nsymbol_B$ contained in a data packet of the lowest transmission rate, i.e. of the basic rate. Therefore, a packet $DP_{00}$ of the channel ch-0 fits into one row, the data packet $DP_{10}$ of the channel ch-1 fits into four rows, the packet $DP_{20}$ of the channel ch-2 fits into one row and the data packet $DP_{N-1,0}$ of the channel ch-N–1 fits into two rows. In order that the memory M contains for each frame period all the data symbols of one packet of each user channel, the minimum number of rows is $$N_{resource} = TR_0/TR_B + TR_1/TR_B + TR_2/TR_B + \ldots TR_n/TR_B + \ldots + TR_{N-1}/TR_B$$
$$= K_0 + K_1 + K_2 + \ldots K_n + \ldots + K_{N-1}.$$

$N_{resource}$ is in the system of course limited by the size of the hardware (i.e. the size of the RAM memory). More importantly, as indicated in FIG. 4-2, the number of rows $N_{resource}$ is limited by the transmission rate of the converter CVT to the modulator MOD. Assuming a basic transmission rate of $TR_B$=32 ksps, i.e. $TR_B$=32 KHz, for the channel ch-0, then the time from providing the symbol $S_{0,0}(0)$ to providing the symbol $S_{0,0}(1)$ is $1/TR_B$=1/32 KHz=31.25 μs as indicated in FIG. 4-2.

Consequently, within a time period of 31.25 μs all elements of the first column must be read out. If the transmission rate with which the symbols are read and provided from the converter CVT to the modulator is e.g. 16.38 MHz, then the maximum number of rows that can be read in 31.25 μs is $N_{resource}$=31.25 μs/(1/16.38 MHz)=512.

A method of converting the stream IDPS into the stream ODSS using the write and read means R, W for writing and reading to the memory M is explained next.

When the first packet $DP_{0,0}$ arrives, since it relates to the channel ch-0 of the basic rate, i.e. $K_0$=1, the data symbols $S_{0,0}(0)$, $S_{0,0}(1)$ . . . $S_{0,0}(Nsymbol_0-1)$ are consecutively written in one row (here the first row 0) of the memory means M. The data symbols of the packet $DP_{0,0}$ exactly fit into one row.

Since the next consecutive data packet $DP_{1,0}$ has four times the number of symbols $Nsymbol_1$, four consecutive data symbols of this data packet are distributed over four rows denoted 1, 2, 3, 4 in column 0. In order that the read means R during the reading of one column can provide the consecutively arranged data symbols as shown in FIG. 4-1, however, there must be performed a special write order. That is, the data symbols of a data packet having an integer multiple $K_n$ of the basic transmission rate are arranged consecutively as sets of $K_n$ (here $K_1=TR_1/TR_B$=4) consecutive data symbols in respective column portions of $K_1$=4 rows.

For example, the symbols $S_{0,0}(0)$ . . . $S_{1,0}(3)$ are arranged as a set of $K_1$=4 consecutive data symbols in the first column 0 at row position 1, 2, 3, 4. The next set of $K_1$ data symbols $S_{1,0}(4)$ . . . $S_{1,0}(7)$ are arranged in the next column 1 again at row positions denoted 1, 2, 3, 4. Thus, the packet $DP_{1,0}$ is written to the memory M in such a manner that consecutively arranged $K_1$=4 data symbols are respectively positioned in one column and the sets of $K_1$=4 consecutive data symbols are respectively consecutively arranged with increasing column number.

Since the data symbols of each packet arrive serially as a serial bit stream at the converter CVT (cf. FIG. 4-1) one possibility of writing in the consecutive data symbols of $DP_{1,0}$ is indicated with the arrow lines in FIG. 4-2, namely a saw-tooth-like writing of all consecutive data symbols for packets containing more symbols than the packets of channel ch-0 can preferably be performed. The last data symbol $S_{1,0}(Nsymbol_1-1)$ is therefore located at column number $Nsymbol_B-1$ and the row denoted 4.

Since the next packet $DP_{2,0}$ of the channel ch-2 contains data symbols of a channel having a basic rate, i.e. $K_2$=1, the writing of the data symbols is consecutively performed with increasing column number at row denoted 5 (just as in the case for the data packet $DP_{0,0}$ to row 0). Likewise, since the packet $DP_{N-1,0}$ has twice the amount of data symbols of the data packet $DP_{0,0}$ (or $DP_{2,0}$), i.e. $K_{N-1}$=2, the data symbols $S_{N-1,0}(0)$ . . . $S_{N-1,0}(Nsymbol_{N-1}-1)$ are written as sets of two consecutive data symbols in each column portion of two rows denoted $N_{resource}-2$, $N_{resource}-1$. It is seen that despite the different transmission rates of the individual channels, resulting in the different number of data symbols per packet, the complete memory M is filled with data symbols of all packets in one frame in a specific order.

If the assignment of the channels to one or more respective rows is maintained from frame period to frame period, then the matrix memory M is always filled in the same order with data symbols from the individual input packets. However, also a dynamic filling of the memory is possible. For example, if the second channel ch-1 stops transmitting data symbols, the third channel need not necessarily be rigidly allocated to the row 5 and it may be allocated to row 1. Thus, while preferably a fixed allocation of channels and rows is possible, also a dynamic allocation is possible, in particular for the case, where it is also allowed that the transmission rate in a respective channel itself changes (provided that the rate never drops below the basic rate which determines the number of columns). If the matrix is large enough and if an indication is present as to how the rate has changed then the matrix will be filled with data symbols channel by channel sequentially.

Now, an embodiment of the write means WM will be described. The write means can comprise respective counters for the respective channels which respectively count up to the maximum number of symbols $Nsymbol_B$, $Nsymbol_1$, $Nsymbol_2$, ... $Nsymbol_{N-1}$ when a respective data packet is written to the memory M. For a channel, e.g. ch-0, ch-2, with the basic rate the counter counts from 0 to 319 (assuming $TR_B$=32 ksps), for a channel, e.g. ch-1, with $4*TR_B$ the counter counts from 0 to 1279 and for a channel, e.g. ch-N−1 with $2*TR_B$ the counter counts from 0 to 639. If the respective counter is a binary counter whose count value is represented by a binary number, then the LSB or the LSBs respectively indicate the number of the row into which a writing shall be performed for the respective symbol.

Figure 7:
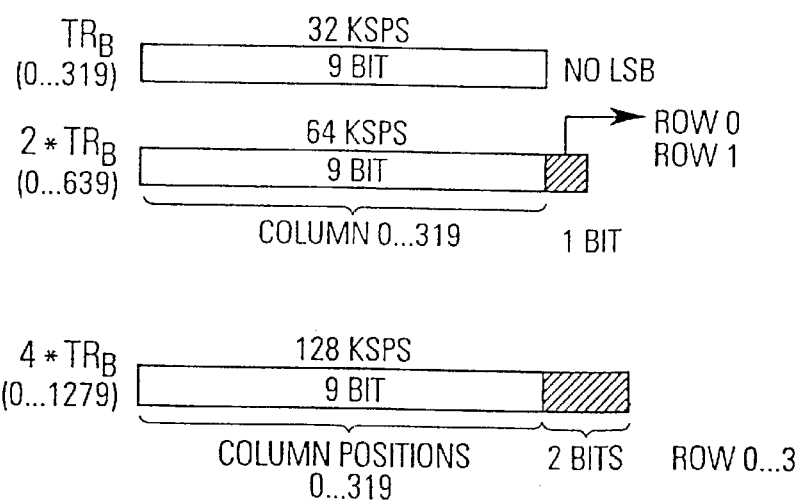
FIG. 7 shows binary counters for a basic rate, a $2*TR_B$ and a $4*TR_B$ channel used for the writing of the symbols to a memory.

For example, as shown in FIG. 7, the basic rate channel comprises 320 symbols and thus the count value can be represented by 9 bit. In this case only one row is needed and thus no row selection via a LSB is necessary.

The $2*TR_B$ rate channel comprises 640 symbols and thus the count value can be represented by 10 bit. In this case the writing is performed in 2 rows, however the LSB is sufficient to indicate with "0" the first row and with "1" the second row. This LSB will change from "0" to "1" during the counting of the data symbols and will thus indicate whether writing shall be performed in the first row or the second row.

The $4*TR_B$ rate channel comprises 1280 symbols and thus the count value can be represented by 11 bit. In this case the writing is performed in 4 rows and the two lowest bits are necessary to indicate with "00" the first row, with "01" the second row, with "10" the third row and with "11" the fourth row. These two lowest bits (LSBs) will change from "00", "01", "10" to "11" during the counting of the data symbols and will thus indicate whether writing shall be performed in the first, second, third or fourth row.

In each above case, as shown in FIG. 7, the rest of the bits in the counter except for the respective LSB(s) will indicate the column position where the writing shall be performed. Thus the counter value indicates for each channel the number of the row and the column position in a simple manner. As will be seen below in the second embodiment, the counters can also be used for performing the interleaved writing to the memory.

Once the writing of the data symbols is finished within one frame period m+1, in the following frame period m+2 (see the frame-wise processing as illustrated in FIG. 3-2) the read out means R reads the data symbols from the memory means M sequentially in the column direction column-by-column, such that all Nresource data symbols from one column are read out preferably serially (possibly also parallely) depending on the processing capabilities of the read means R. However, since the data symbols have been written to the memory M in a specific order, the reading out of one column will result in the provision of a data symbol stream of data symbols consecutively arranged as indicated with "1-st column" in FIG. 4-1. That is, the CDMA modulator MOD receives $K_n$ data symbols from each data packet within each read cycle of the read means R, in FIG. 4-2: $K_0$=1+$K_1$=4+$K_2$=1+$K_{N-1}$=2 data symbols, i.e. in total 8 data symbols.

The readout rate is linked indirectly to the frame period used for performing the sequential write-in. In fact, one column, e.g. column 0, is read by the read means R and within for example the first $1/TR_B$=31.25 μs the CDMA modulator takes out and distributes the data symbols to a respective spreading means in the modulator MOD. In the spreading means of a real system e.g. 128, 64 or 32 chips for 32, 64, 128 ksps channels and a chip rate of 4096 Mcps are used. That is, the single data symbol of channel ch-0 is spread with a short code to 128 chips. Four data symbols of the channel ch-1 are spread with a short code with a smaller number of chips, for example 32 chips. The data symbol of channel ch-2 is spread with the 128 chip spreading sequence and the two data symbols of channel ch-N−1 are spread with a short code of 64 chips each. Consequently, for each channel 128 chips are available which can be combined chip by chip, i.e. 1*128=4*32=2*64=128 chips.

Once, the CDMA modulator has finished the assignment of the bits to the respective spreading units, the CDMA modulator MOD gives the external synchronization clock (which is synchronized to the frame synchronization pulse, but has a higher frequency) to the read means R which then performs the reading of the next column, i.e. all second data symbols from the respective packets. A single data packet of all channels is written to the memory within 10 ms, and within the time period of $1/TR_B$ (e.g. $TR_B$=32 KHz) all symbols from one column must be read and provided to the modulator. If the number of resources to be read is fixed (e.g. $N_{resource}$=512), then the read rate must be at least $N_{resource}*TR_B$=16.38 MHz, since otherwise it would not be possible to read out all the data of all channels in one synchronization clock period.

As shown in FIG. 4-2, each data symbol is stored at a particular memory location determined by the channel assignment to the respective rows and determined by the transmission rate of the respective channel. In the simplest case, one data symbol may only be a single bit, if for example no QPSK modulation has been applied. In this case each memory location only contains one bit. If the input data packet stream IDPS has data symbols each containing two bits, for example an I bit and a Q bit, then each memory location contains two bits which are stored together at one memory location. This causes no problem, since a conventional RAM can store, dependent on the configuration of the word width, up to 8, 16 or 32 bits simultaneously.

Furthermore, as explained before, the central requirement is that the CDMA modulator MOD is provided—during one read cycle—with respective $K_n$ (integer multiple of the transmission rate) data symbols of each data packet dependent on the transmission rate. In FIG. 4-2 the writing as indicated with the arrow lines is performed in such a manner, that the data symbols of each set are arranged consecutively in each column. This ensures that the CDMA modulator is always provided with the correct data symbol set during the column-wise reading out of the memory.

During the reading out of the memory a serial data stream is provided in the direction of the CDMA modulator since the memory positions are read out sequentially one after the other in the column direction as explained above. On the other hand, the downlink spreader units may be provided in parallel and the read out symbols can be distributed to these spreader units arbitrarily. Within each spreader unit the read out symbols are temporarily stored in an intermediate memory and are subsequently pre-spread to the rate which is the highest for the physical channels (e.g. 256 ksps). As already mentioned above with reference to table 1, this is done by means of a repetitive reading out (repeating) of the respective symbol from the intermediate memory in the spreader unit.

An encoder ENC of a CDMA transmitter as shown in FIG. 2 according to the invention comprises a convolutional encoder CC, an interleaver INT, a QPSK modulator (I, Q selector) QPSK and a converter CVT as shown in FIG. 4-1, which are connected in this order as illustrated in FIG. 3-1. The serial bit stream SDBS is input to the convolutional coder CC which outputs a convolutionally encoded data bit stream CCBS to the interleaver IL, the interleaver IL outputs an interleaved convolutional encoded data bit stream ICBS to the QPSK modulator QPSK which then performs the QPSK modulation on the bits of the interleaved convolutional encoded data bit stream ICBS. Having performed the QPSK modulation (I, Q selection), the input data packet stream consisting of the convolutional encoded, interleaved and modulated data symbols, i.e. the input data packet stream IDPS, is input to the converter CVT. In this case, the interleaving and QPSK modulation is performed before the data symbol (or bit) stream is converted in the converter CVT to provide the output stream ODSS to the CDMA modulator MOD.

Figure 5:
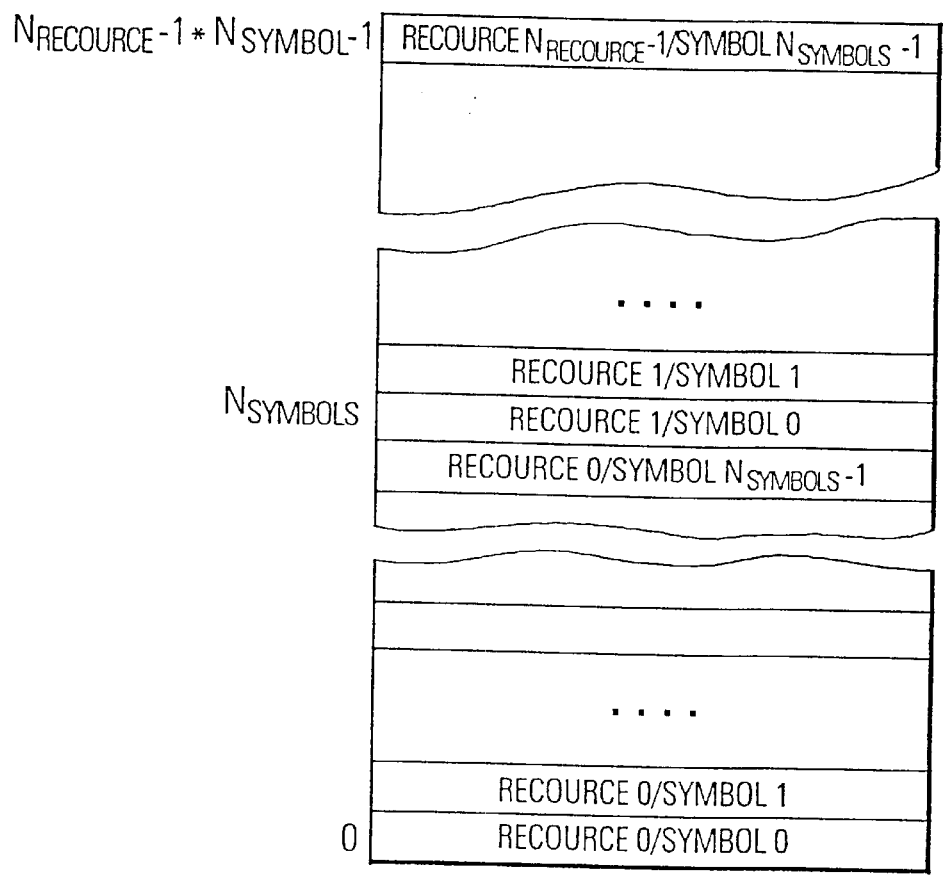
FIG. 5; shows the entries in a real RAM.

FIG. 5 shows the possible sequential arrangement of serial data of a plurality of user channels each having a predetermined number of symbols in a hardware RAM-structure, which, however, corresponds to the one shown in FIG. 4-2.

Second Embodiment (Interleaving & Conversion)

As explained above, generally in a conventional interleaver IL as shown in FIG. 3-1 a serial bit stream of data bits from individual data packets is written into an interleaving memory having a predetermined interleaving depth in e.g. the row direction and the individual bits are read from the interleaving memory in the column direction, as is well-known in the art.

Furthermore, in the conventional system of FIG. 3-1, the QPSK modulation (I, Q selection) is performed after the interleaving, i.e. once the interleaved bit stream ICBS is read out from the interleaver IL, the I, Q selection is performed by selecting a respective I, Q-bits from the interleaved bit stream (for example, a first bit is assigned as an I-bit and a second bit is assigned as a Q-bit, a third bit is assigned as an I-bit and so on). The result is that the input data packet stream IDPS contains the consecutively arranged data symbols.

Based on the recognizing of a similarity between a conventional interleaving process and the writing and reading of the memory M, hereinafter a second embodiment of the invention will be described, where the modulation, the interleaving as well as the packet conversion as in FIG. 4-2 is simultaneously carried out by the converter, i.e. by contrast to FIG. 3-1 the QPSK modulation is performed before the interleaving process.

For explaining the second embodiment, it is first assumed that the input stream to the converter CVT is now a serial data bit stream SDBS containing the consecutive bits of the respective data packets as shown in FIG. 3-1. The input data packet stream to the converter CVT can also be the convolutional encoded bit stream CCBS. In general, the input to the converter CVT is a serial bit stream of data bits from the individual packets as illustrated in FIG. 3-1.

If the memory M is to be used for performing the interleaving as well as the data packet storing in the predetermined order as indicated in FIG. 4-2, the writing means W must basically perform two steps. In a first step, the respective data bits forming one data symbol must be selected from the input stream, e.g. CCBS or SDBS. Once the selection of the corresponding bits for forming the data symbols have been carried out, in a second step the data symbols are consecutively written into the memory M in a specific interleaving writing order. If then the read means R performs the reading as explained with reference to FIG. 4-2, the interleaving can be performed at the same time, when the writing process is changed to the specific interleaving order as explained below.

Without loss of generality, the combined interleaving and converting can be easily understood by considering one channel or respectively a data packet of the basic transmission rate. In this case, one row of the memory M contains 320 symbols if a basic rate of e.g. 32 ksps is used.

The precondition is that the write means receives an input data stream comprising 320 QPSK symbols from the I, Q selector (modulator) QPSK. Assuming an interleaver matrix of 16×20 symbols (16 columns $N_W$ and 20 rows $N_R$), the writing order to the memory matrix for channel ch-0 and ch-2 must be changed from the sequential writing in the row direction (cf. FIG. 4-2)

Figures 3, 6:
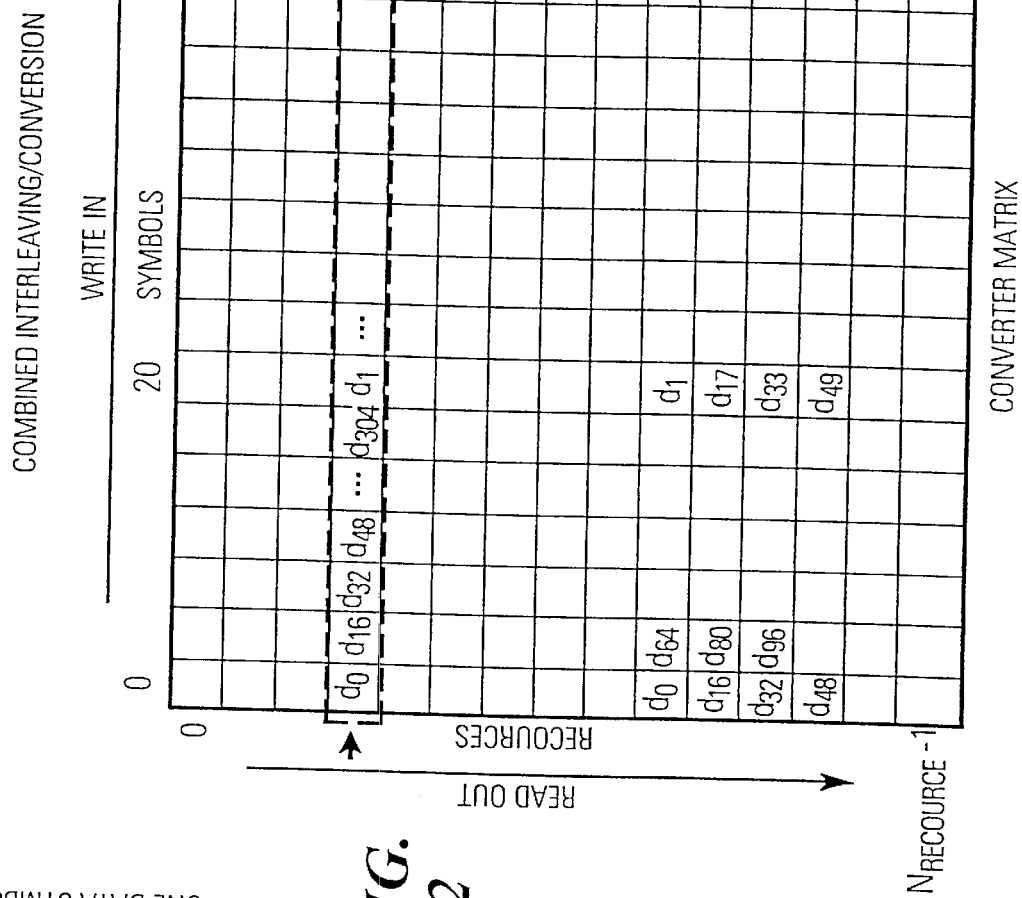
Figures 1, 6:
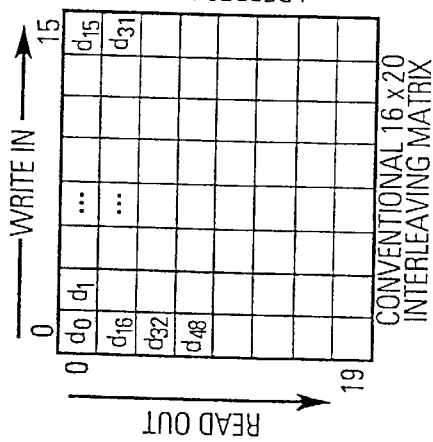
Figures 2, 6:
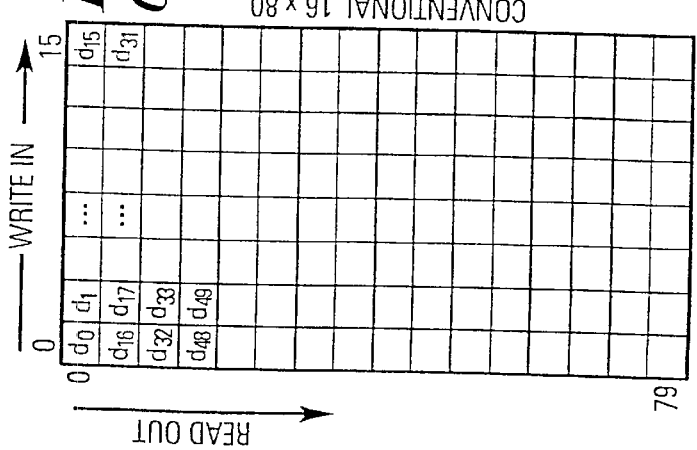

$0 \rightarrow 1 \rightarrow 2 \rightarrow 3 \rightarrow 4 \rightarrow 5 \rightarrow 6 \rightarrow 7 \ldots \rightarrow 319$ to $0 \rightarrow 20 \rightarrow 40 \rightarrow 60 \rightarrow \ldots \rightarrow 300 \rightarrow 1 \rightarrow 21 \rightarrow 41 \rightarrow \ldots \rightarrow 319$ where the numbers denote a respective writing column number (cf. FIG. 6-3). Hence, with this writing order of jumping respectively 20 column positions (20=number of rows in the case of using an interleaving matrix), in this single row the interleaving of the input data symbol stream is obtained, when columns are read one by one from left to right.

As a comparison, FIG. 6-1 shows the normal interleaving matrix. The resulting output data stream to the converter, if the interleaving was done separately, would be d0, d16, d32, d48, . . . ,d1, d17, . . . ,d319 and this must essentially also be the case for reading out the conversion matrix in the column direction successively, only that here in between also data symbols of other packets are read out.

FIG. 6-3 shows how the interleaving can be combined with the conversion when using the converter matrix of FIG. 4-2. As shown in FIG. 6-3, the non-interleaved data symbol input stream d0, d1, d2, d3, d4, . . . d319 is written to the combined interleaver/converter memory in one row (assuming basic rate) in the appropriate column positions selected in accordance with what would happen in the conventional interleaving matrix. That is the writing starts with d0 in column 0 and continues in steps of 20 columns for writing d1, d2 etc., until the end of the row is reached. Then the writing is stepped back to the left border again and continues at the column position 0+1=1, etc.

Comparing e.g. FIG. 6-3 with the example of conventional interleaving as in FIG. 6-1, it becomes clear that the writing of the symbols in this specific order is equivalent to performing an interleaving for this packet, since during the column wise reading (the matrix is still read in the column direction in order to fulfill the conversion task) first symbol do, then symbol 16, then symbol 32 etc is output yielding the same interleaved stream as in FIG. 6-1, only that due to the column-wise reading the conversion as well as the interleaving for different transmission rates can be performed simultaneously for all channels.

Although FIG. 6-1, 6-2 only show the writing/reading in the specific order for the case of the basic transmission rate, where all symbols of one packet fit into one row, it should be understood the a similar writing order can be obtained when the case of a higher transmission rate is considered where all symbols of one packet will only fit into several rows as explained with reference to the channel ch-1, ch-$_{N-1}$ in FIG. 4-2.

For example, assuming that data packets of channels having a higher transmission rate (e.g. ch-N−1 or ch-1 in FIG. 4-2) are also to be interleaved by a process that would correspond to an interleaving in an interleaving matrix again with 16 columns (and consequently 40 rows for $2*TR_B$ to interleave 640 symbols; and 80 rows for $4*TR_B$ to interleave 1280 symbols, respectively) the writing to the memory M starts at the reference row (assigned to the respective channel of higher transmission rate; e.g. row 1 in FIG. 4-2 for $4*TR_B$) and then the writing is continued in this row in every 20-th column. When the column index exceeds the-maximum number of columns minus 1 in the memory M (319), e.g. 1→20→40→ . . . →300, the writing continues in the first column in the next higher row. This is continued until the writing index exceeds the maximum number of symbols (e.g. 1280 for $4*TR_B$), i.e. when the process has finished writing to the highest row associated with the respective channel (e.g. row 4 of the 1st channel ch-1 with $4*TR_B$). Then the process continues at the second column position in the first row belonging to the channel. FIG. 6-2 shows the conventional interleaving matrix with interleaving depth 16 for the case of $4*TR_B$ and FIG. 6-3 shows the corresponding entries.

In the above example for interleaving the data symbols of higher transmission rates, it was assumed that the process corresponds to the interleaving in an interleaving memory where respectively the number of columns (e.g. the interleaving depth 16) would be kept constant and the number of columns is increased (e.g. from 20 to 80 for $4*TR_B$) in accordance to the transmission rate. However, the 1280 symbols of the channel of $4*TR_B$ could be interleaved in a different manner, for example by a process that would correspond to an interleaving in an interleaving memory having 32 columns and 40 rows.

Figures 4B, 6:
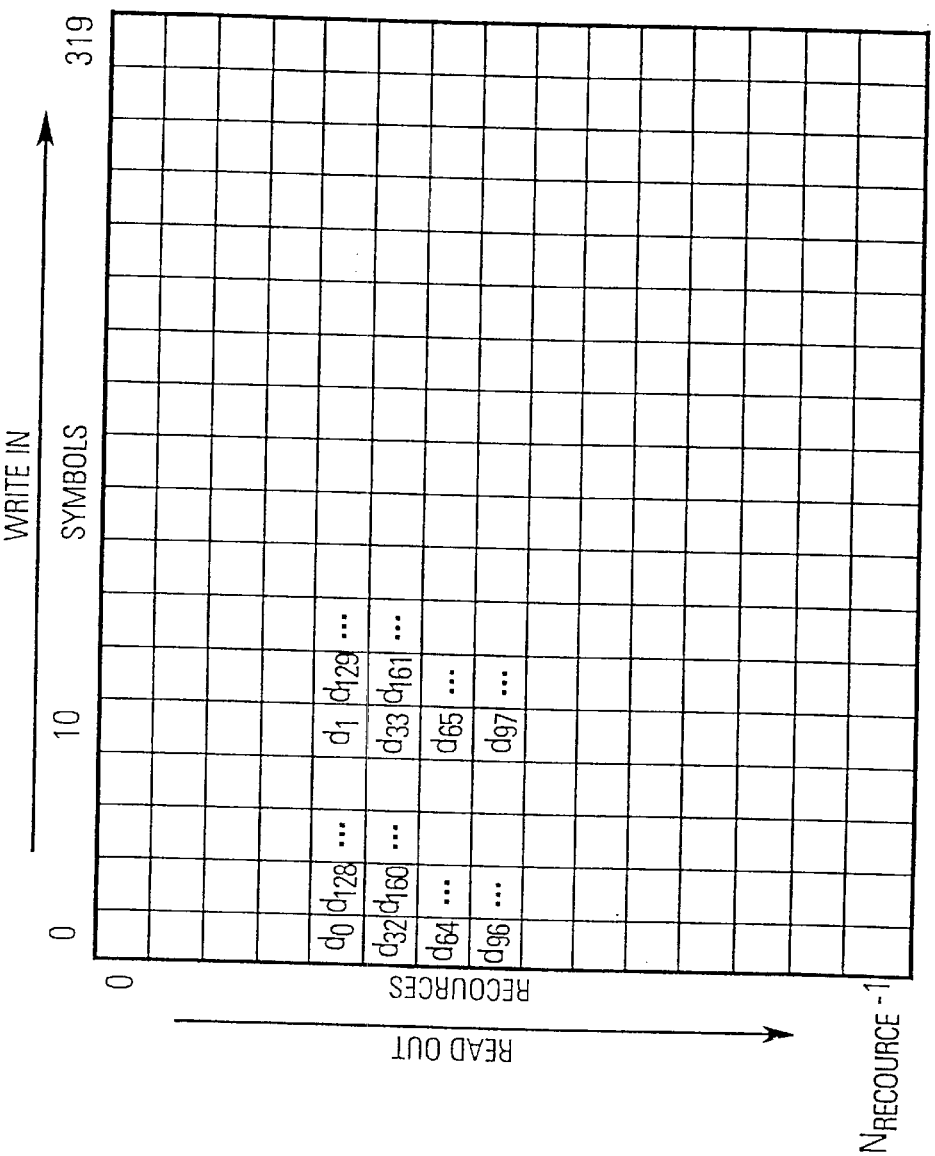
Figures 4A, 6:
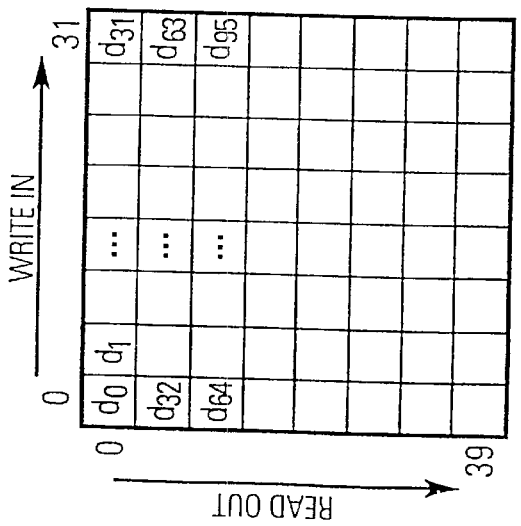

FIG. 6-4a shows the conventional interleaving matrix with interleaving depth 32 for the case of $4*TR_B$ and FIG. 6-4b shows the corresponding entries in the converter matrix, similar as in FIG. 6-3. As shown in FIG. 6-4, even in this case the writing procedure to the memory M can be used, only that now the shift value for the column writing is different, namely 10 instead of 20. Thus, it is even possible to derive writing schemes for the interleaved writing to the memory M such that each channel is interleaved in a different manner (i.e. even with different interleaving depth).

Thus, choosing the appropriate writing order dependent on the transmission rate and the interleaving depth (number of columns), the interleaving can be combined with the conversion process. Using only one memory for the interleaving and the conversion increases the efficiency and the speed of the processing.

Now an embodiment of the write means W for performing the interleaved writing as in FIG. 6-1, FIG. 6-2, FIG. 6-3 is described. The basic interleaving uses a writing corresponding to an interleaving matrix of $N_R=20$ and $N_W=16$ as indicated in FIG. 6. The counters as explained with reference to FIG. 7 can also be used for the case of the interleaved writing process, only that the counter is not incremented with +1 but with $+N_R$, wherein after $N_W$ write operations the procedure is started again from the respective next higher column position +1. To allow the respective bits still to indicate the respective column positions (cf. FIG. 7) the counter value must be reset to this next higher column position according to the following rule. If the present counter value exceeds the number of symbols per packet $Nsymbol_n$ for the particular channel, then the new counter value is set as follows:

counter>$Nsymbol_n$→counter=counter-$Nsymbol_n$+1

If a setting of the counter value is performed as indicated above, the LSB(s) will still indicate the appropriate row if more than one row is necessary (i.e. for higher rate channels). Thus the counters can also easily be used for the case of the interleaved writing.

INDUSTRIAL APPLICABILITY

The converter and the conversion method according to the invention finds particular application in an encoder of a CDMA transmitter. However, the invention is not restricted to such a CDMA system and might be used in any other telecommunication system in which a modulator needs to be provided with respective data symbols of respective data packets simultaneously, when each of the user channels have different transmission rate.

The invention is also not limited to an encoder containing the specific convolutional encoder CC, since other coding schemes may be used for the channel encoding. Furthermore, in the above description, the row direction can of course be exchanged with the column direction without any loss of generality.

Furthermore, the invention is not restricted to the described embodiments and variations and modifications may be carried out on the basis of the above teachings. In particular, the invention can comprise combinations of individual features in the claims even if not specifically described in the description.

Reference numerals in the claims only serve clarification purposes and do not limit the scope of protection.

What is claimed is:

1. A converter (CVT) for converting an input data packet stream (IDPS) of consecutive data packets ($DP_{0,0}$, $DP_{1,0}$, $DP_{2,0}$ . . . $DP_{N-1,0}$) each data packet including user ($US_0$, $US_1$, $US_2$, . . . $US_{N-1}$) data in the form of a predetermined number ($Nsymbol_0$; $Nsymbol_1$; $Nsymbol_{N-1}$) of consecutive data symbols ($S_{0,0}(0)$, $S_{0,0}(1)$ . . . $S_{0,0}(Nsymbol_0-1)$; $S_{1,0}(0)$, $S_{1,0}(1)$ . . . $S_{1,0}(Nsymbol_1-1)$; $S_{2,0}(0)$, $S_{2,0}(1)$ . . . $S_{2,0}(Nsymbol_2-1)$; . . . $S_{N-1,0}(0)$, $S_{N-1,0}(1)$ . . . $S_{N-1,0}(Nsymbol_{N-1}-1)$) from a plurality of N user channels (ch-0, . . . , ch-N−1), each user channel having a predetermined transmission rate $TR_0$, $TR_1$, $TR_2$, . . . ,$TR_n$, . . . $TR_{N-1}$, being defined as a basic transmission rate $TR_B$ or an integer multiple $TR_n=K_n*TR_B$ thereof, into an output data symbol stream (ODSS) in which a respective number $K_n$ of data symbols ($S_{0,0}(0)$; $S_{1,0}(0)$, $S_{1,0}(1)$, $S_{1,0}(2)$, $S_{1,0}(3)$; $S_{2,0}(0)$; . . . $S_{N-1,0}(0)$, $S_{N-1,0}(1)$) of each data packet are sequentially arranged, comprising:

a) a memory means (M) having a number of columns (0, . . . $Nsymbol_B-1$) and a number of rows (0 . . . $N_{resource}-1$);

b) a write means (W) for writing the data symbols of said consecutive data packets into said memory means (RAM), such that the data symbols of a data packet having the basic transmission rate $TR_B$ are consecutively arranged in one row and the data symbols of data packets having an integer multiple $TR_n=K_n*TR_B$ of the basic transmission rate are arranged consecutively as sets of $K_n$ consecutive data symbols in respective column portions of $K_n$ rows; and c) a read means (R) for providing said output data symbol stream (ODSS) by reading said data symbols from the memory means (RAM) sequentially in the column direction, whereby whenever all $TR_0/TR_B+TR_1/TR_B+ \ldots +TR_n/TR_B+ \ldots +TR_{N-1}/TR_B$ data symbols of one column have been read out in a time interval of $1/TR_B$, the reading is continued in the next column at the first row position.

2. A converter according to claim 1, wherein
said memory means (M) has a number of columns $(0 \ldots \text{Nsymbol}_B-1)$ corresponding to the number of symbols $(\text{Nsymbol}_B)$ contained in a data packet of a user channel (ch0, ch2) having the basic transmission rate and has a number of rows $(0 \ldots N_{resource}-1)$ corresponding to $TR_0/TR_B+TR_1/TR_B+TR_2/TR_B+\ldots+TR_n/TR_B+\ldots+TR_{N-1}/TR_B$.

3. A converter according to claim 1, wherein
said write means (W) performs said writing of data symbols synchronized to a frame synchronization clock such that in each frame the data symbols of one data packet of each user channel is stored in said memory (M).

4. A converter according to claim 1, wherein
said read means (R) performs said reading of the data symbols from the columns of said memory (M) synchronized to an external synchronization clock provided by a CDMA modulator (MOD) or globally such that the reading from a next column at the first row position starts with each external synchronization clock.

5. A converter according to claim 1, wherein
said read means (R) performs said reading at a clock rate of $N_{resource}*TR_B$ which is higher than said writing performed by said write means (W), where Nresource is the number of rows of the memory and $TR_B$ is the basic transmission rate.

6. A converter according to claim 1, wherein
each data symbol consists of a predetermined number of bits and said bits are stored together at each memory location of said memory (M).

7. An encoder (ENC) of a CDMA transmitter comprising a convolutional encoder (CC), an interleaver (IL), an I, Q selector (QPSK) and a converter (CVT) according to claim 1 connected in this order, wherein a serial data bit stream (SDBS) of consecutive data bits of said consecutive data packets is input to said convolutional encoder (CC) which outputs a convolutional encoded data bit stream (CCBS) to said interleaver (IL), said interleaver (IL) outputs an interleaved convolutional encoded data bit stream (ICBS) to said I, Q selector (QPSK) and said I, Q selector selects I, Q bits from said interleaved convolutional encoded data bit stream (ICBS) and supplies said input data packet stream (IDPS) to said converter.

8. A CDMA transmitter (BTS) including an encoder (ENC) according to claim 7 and a CDMA modulator (MOD) to which said encoder (ENC) outputs said output data symbol stream (ODSS).

9. A CDMA telecommunication system including at least one CDMA transmitter (BTS) according to claim 8.

10. A converter according to claim 1, wherein
means are provided for receiving an input data bit stream (CCBS) of consecutive data bits of said consecutive data packets and for performing an I, Q selection, wherein said writing means performs an interleaving while writing and reading said data symbols into and from said memory in a specific interleaving order.

11. A method for converting an input data packet stream (IDPS) of consecutive data packets $(DP_{0,0}, DP_{1,0}, DP_{2,0} \ldots DP_{N-1,0})$ each data packet including user $(US_0, US_1, US_2, \ldots US_{N-1})$ data in the form of a predetermined number $(\text{Nsymbol}_0; \text{Nsymbol}_1; \text{Nsymbol}_{N-1})$ of consecutive data symbols $(S_{0,0}(0), S_{0,0}(1) \ldots S_{0,0}(\text{Nsymbol}_0-1); S_{1,0}(0), S_{1,0}(1) \ldots S_{1,0}(\text{Nsymbol}_1-1); S_{2,0}(0), S_{2,0}(1) \ldots S_{2,0}(\text{Nsymbol}_2-1); \ldots S_{N-1,0}(0) S_{N-1,0}(1) \ldots S_{N-1,0}(\text{Nsymbol}_{N-1}-1))$ from a plurality of N user channels (ch-0, \ldots, ch-N-1), each user channel having a predetermined transmission rate $TR_0, TR_1, TR_2, \ldots, TR_n, \ldots TR_{N-1}$, being defined as a basic transmission rate $TR_B$ or an integer multiple $TR_n=K_n*TR_B$ thereof, into an output data symbol stream (ODSS) in which a respective number $K_n$ of data symbols $(S_{0,0}(0); S_{1,0}(0), S_{1,0}(1), S_{1,0}(2), S_{1,0}(3); S_{2,0}(0); \ldots S_{N-1,0}(0), S_{N-1,0}(1))$ of each data packet are sequentially arranged, comprising the following steps:

a) providing a memory means (M) having a number of columns $(0, \ldots \text{Nsymbol}_B-1)$ and a number of rows $(0 \ldots N_{resource}-1)$;

b) writing the data symbols of said consecutive data packets into said memory means (RAM), such that the data symbols of a data packet having the basic transmission rate $TR_B$ are consecutively arranged in one row and the data symbols of data packets having an integer multiple $TR_n=K_n*TR_B$ of the basic transmission rate are arranged consecutively as sets of $K_n$ consecutive data symbols in respective column portions of $K_n$ rows; and c) reading said data symbols from the memory means (RAM) sequentially in the column direction, whereby whenever all $TR_0/TR_B+TR_1/TR_B+TR_2/TR_B+\ldots+TR_n/TR_B+\ldots+TR_N/TR_B$ data symbols of one column have been read out in a time interval of $1/TR_B$, the reading is continued in the next column at the first row position, in order to provide said output data symbol stream (ODSS).

12. A method according to claim 11, including the step of providing said memory means (M) to have a number of columns $(0 \ldots \text{Nsymbol}-1)$ corresponding to the number of symbols $(\text{Nsymbol}_B)$ contained in a data packet of a user channel (ch0, ch2) having the basic transmission rate and has a number of rows $(0 \ldots \text{Nresource}-1)$ corresponding to $TR_0/TR_B+TR_1/TR_B+TR_2/TR_B+\ldots+TR_n/TR_B+\ldots+TR_{N-1}/TR_B$.

13. A method according to claim 11, wherein
said writing of data symbols is performed synchronized to a frame synchronization clock such that in each frame the data symbols of one data packet of each user channel are stored in said memory (M).

14. A method according to claim 11, wherein
said reading of the data symbols from the columns of said memory (M) is performed synchronized to an external synchronization clock provided by a CDMA modulator (MOD) or globally such that the reading from a next column at the first row position starts with each external synchronization clock.

15. A method according to claim 11, wherein
said reading is performed at a clock rate of $N_{resource}*TR_B$ which is higher than said writing, where $N_{resource}$ is the number of rows of the memory and $TR_B$ is the basic transmission rate.

16. A method according to claim 11, wherein
each data symbol consists of a predetermined number of bits and said bits are stored during said writing step together at each memory location of said memory (M).

17. A method according to claim 11, wherein
said input data symbol stream (IDSS) is created by the following steps:
inputting an input data bit stream (SDBS) of consecutive data bits of said consecutive data packets to a convolutional coder (CC) and outputting a convolutional encoded data bit stream (CCBS) to an interleaver (IL);

interleaving said convolutional encoded data bit stream (ICBS) in said interleaver (IL) and outputting an interleaved convolutional encoded data bit stream to an I, Q selector (QPSK); and performing an I, Q selection of bits from an interleaved convolutional encoded data bit stream in said I, Q selector and supplying the output from said I, Q selector as said input data packet stream (IDPS).

18. A method according to claim 11, including the steps of receiving an input data bit stream (CCBS) of consecutive data bits of said consecutive data packets, performing an I, Q selection (QPSK), and performing an interleaving while writing and reading said data symbols into and from said memory in a specific order.

19. A converter (CVT) for converting an input data packet stream (IDPS) of consecutive data packets ($DP_{0,0}$, $DP_{1,0}$, $DP_{2,0}$ ... $DP_{N-1,0}$) each data packet including user ($US_0$, $US_1$, $US_2$, ... $US_{N-1}$) data in the form of a predetermined number ($Nsymbol_0$; $Nsymbol_1$; $Nsymbol_{N-1}$) of consecutive data symbols ($S_{0,0}(0)$, $S_{0,0}(1)$ ... $S_{0,0}(Nsymbol_0-1)$; $S_{1,0}(0)$, $S_{1,0}(1)$ ... $S_{1,0}(Nsymbol_1-1)$; $S_{2,0}(0)$, $S_{2,0}(1)$ ... $S_{2,0}(Nsymbol_2-1)$; ... $S_{N-1,0}(0)$, $S_{N-1,0}(1)$ ... $S_{N-1,0}(Nsymbol_{N-1}-1)$) from a plurality of N user channels (ch-0, ..., ch-N-1), each user channel having a predetermined transmission rate $TR_0$, $TR_1$, $TR_2$, ..., $TR_n$, ... $TR_{N-1}$, being defined as a basic transmission rate $TR_B$ or an integer multiple $TR_n = K_n * TR_B$ thereof, into an output data symbol stream (ODSS) in which a respective number $K_n$ of data symbols ($S_{0,0}(0)$; $S_{1,0}(0)$, $S_{1,0}(1)$, $S_{1,0}(2)$, $S_{1,0}(3)$; $S_{2,0}(0)$; ... $S_{N-1,0}(0)$, $S_{N-1,0}(1)$) of each data packet are sequentially arranged, comprising:

a) a memory means (M) having a number of columns (0, ... $Nsymbol_B-1$) and a number of rows (0 ... $N_{resource}-1$);

b) a write means (W) for writing the data symbols of said consecutive data packets into said memory means (RAM), such that the data symbols of a data packet having the basic transmission rate $TR_B$ are consecutively arranged in one row and the data symbols of data packets having an integer multiple $TR_n = K_n * TR_B$ of the basic transmission rate are arranged consecutively as sets of $K_n$ consecutive data symbols in respective column portions of $K_n$ rows; and c) a read means (R) for providing said output data symbol stream (ODSS) by reading said data symbols from the memory means (RAM) sequentially in the column direction, whereby whenever all $TR_0/TR_B + TR_1/TR_B + ... + TR_n/TR_B + ... + TR_{N-1}/TR_B$ data symbols of one column have been read out in a time interval of $1/TR_B$, the reading is continued in the next column at the first row position; and wherein said memory means (M) has a number of columns (0 ... $Nsymbol_B-1$) corresponding to the number of symbols ($Nsymbol_B$) contained in a data packet of a user channel (ch0, ch2) having the basic transmission rate and has a number of rows (0 ... $N_{resource}-1$) corresponding to $TR_0/TR_B + TR_1/TR_B + TR_2/TR_B + ... + TR_n/TR_B + ... + TR_{N-1}/TR_B$; and wherein said write means (W) performs said writing of data symbols synchronized to a frame synchronization clock such that in each frame the data symbols of one data packet of each user channel is stored in said memory (M); and wherein said read means (R) performs said reading of the data symbols from the columns of said memory (M) synchronized to an external synchronization clock provided by a CDMA modulator (MOD) or globally such that the reading from a next column at the first row position starts with each external synchronization clock; and wherein said read means (R) performs said reading at a clock rate of $N_{resource} * TR_B$ which is higher than said writing performed by said write means (W), where Nresource is the number of rows of the memory and $TR_B$ is the basic transmission rate.

20. A converter (CVT) for converting an input data packet stream (IDPS) of consecutive data packets ($DP_{0,0}$, $DP_{1,0}$, $DP_{2,0}$ ... $DP_{N-1,0}$) each data packet including user ($US_0$, $US_1$, $US_2$, ... $US_{N-1}$) data in the form of a predetermined number ($Nsymbol_0$; $Nsymbol_1$; $Nsymbol_{N-1}$) of consecutive data symbols ($S_{0,0}(0)$, $S_{0,0}(1)$ ... $S_{0,0}(Nsymbol_0-1)$; $S_{1,0}(0)$, $S_{1,0}(1)$ ... $S_{1,0}(Nsymbol_1-1)$; $S_{2,0}(0)$, $S_{2,0}(1)$ ... $S_{2,0}(Nsymbol_2-1)$; ... $S_{N-1,0}(0)$, $S_{N-1,0}(1)$ ... $S_{N-1,0}(Nsymbol_{N-1}-1)$) from a plurality of N user channels (ch-0, ..., ch-N-1), each user channel having a predetermined transmission rate $TR_0$, $TR_1$, $TR_2$, ..., $TR_n$, ... $TR_{N-1}$, being defined as a basic transmission rate $TR_B$ or an integer multiple $TR_n = K_n * TR_B$ thereof, into an output data symbol stream (ODSS) in which a respective number $K_n$ of data symbols ($S_{0,0}(0)$; $S_{1,0}(0)$, $S_{1,0}(1)$, $S_{1,0}(2)$, $S_{1,0}(3)$; $S_{2,0}(0)$; ... $S_{N-1,0}(0)$, $S_{N-1,0}(1)$) of each data packet are sequentially arranged, comprising:

a) a memory means (M) having a number of columns (0, ... $Nsymbol_B-1$) and a number of rows (0 ... $N_{resource}-1$);

b) a write means (W) for writing the data symbols of said consecutive data packets into said memory means (RAM), such that the data symbols of a data packet having the basic transmission rate $TR_B$ are consecutively arranged in one row and the data symbols of data packets having an integer multiple $TR_n = K_n * TR_B$ of the basic transmission rate are arranged consecutively as sets of $K_n$ consecutive data symbols in respective column portions of $K_n$ rows; and c) a read means (R) for providing said output data symbol stream (ODSS) by reading said data symbols from the memory means (RAM) sequentially in the column direction, whereby whenever all $TR_0/TR_B + TR_1/TR_B + ... + TR_n/TR_B + ... + TR_{N-1}/TR_B$ data symbols of one column have been read out in a time interval of $1/TR_B$, the reading is continued in the next column at the first row position; and wherein each data symbol consists of a predetermined number of bits and said bits are stored together at each memory location of said memory (M).

21. A converter (CVT) for converting an input data packet stream (IDPS) of consecutive data packets ($DP_{0,0}$, $DP_{1,0}$, $DP_{2,0}$ ... $DP_{N-1,0}$) each data packet including user ($US_0$, $US_1$, $US_2$, ... $US_{N-1}$) data in the form of a predetermined number ($Nsymbol_0$; $Nsymbol_1$; $Nsymbol_{N-1}$) of consecutive data symbols ($S_{0,0}(0)$, $S_{0,0}(1)$ ... $S_{0,0}(Nsymbol_0-1)$; $S_{1,0}(0)$, $S_{1,0}(1)$ ... $S_{1,0}(Nsymbol_1-1)$; $S_{2,0}(0)$, $S_{2,0}(1)$ ... $S_{2,0}(Nsymbol_2-1)$; ... $S_{N-1,0}(0)$, $S_{N-1,0}(1)$ ... $S_{N-1,0}(Nsymbol_{N-1}-1)$) from a plurality of N user channels (ch-0, ..., ch-N-1), each user channel having a predetermined transmission rate $TR_0$, $TR_1$, $TR_2$, ..., $TR_n$, ... $TR_{N-1}$, being defined as a basic transmission rate $TR_B$ or an integer multiple $TR_n = K_n * TR_B$ thereof, into an output data symbol stream (ODSS) in which a respective number $K_n$ of data symbols ($S_{0,0}(0)$; $S_{1,0}(0)$, $S_{1,0}(1)$, $S_{1,0}(2)$, $S_{1,0}(3)$; $S_{2,0}(0)$; ... $S_{N-1,0}(0)$, $S_{N-1,0}(1)$) of each data packet are sequentially arranged, comprising:

a) a memory means (M) having a number of columns (0, ... $Nsymbol_B-1$) and a number of rows (0 ... $N_{resource}-1$);

b) a write means (W) for writing the data symbols of said consecutive data packets into said memory means (RAM), such that the data symbols of a data packet having the basic transmission rate $TR_B$ are consecutively arranged in one row and the data symbols of data packets having an integer multiple $TR_n=K_n*TR_B$ of the basic transmission rate are arranged consecutively as sets of $K_n$ consecutive data symbols in respective column portions of $K_n$ rows; and c) a read means (R) for providing said output data symbol stream (ODSS) by reading said data symbols from the memory means (RAM) sequentially in the column direction, whereby whenever all $TR_0/TR_B + TR_1/TR_B + \ldots + TR_n/TR_B + \ldots + TR_{N-1}/TR_B$ data symbols of one column have been read out in a time interval of $1/TR_B$, the reading is continued in the next column at the first row position; and wherein means are provided for receiving an input data bit stream (CCBS) of consecutive data bits of said consecutive data packets and for performing an I, Q selection, wherein said writing means performs an interleaving while writing and reading said data symbols into and from said memory in a specific interleaving order.

22. A method for converting an input data packet stream (IDPS) of consecutive data packets ($DP_{0,0}$, $DP_{1,0}$, $DP_{2,0}$ ... $DP_{N-1,0}$) each data packet including user ($US_0$, $US_1$, $US_2$, ... $US_{N-1}$) data in the form of a predetermined number ($Nsymbol_0$; $Nsymbol_1$; $Nsymbol_{N-1}$) of consecutive data symbols ($S_{0,0}(0)$, $S_{0,0}(1)$ ... $S_{0,0}(Nsymbol_0-1)$ $S_{1,0}(0)$, $S_{1,0}(1)$ ... $S_{1,0}(Nsymbol_1-1)$; $S_{2,0}(0)$, $S_{2,0}(1)$ ... $S_{2,0}(Nsymbol_2-1)$; ... $S_{N-1,0}(0)$, $S_{N-1,0}(1)$ ... $S_{N-1,0}(Nsymbol_{N-1}-1)$) from a plurality of N user channels (ch-0, ..., ch-N-1), each user channel having a predetermined transmission rate $TR_0, TR_1, TR_2, \ldots, TR_n, \ldots TR_{N-1}$, being defined as a basic transmission rate $TR_B$ or an integer multiple $TR_n=K_n*TR_B$ thereof, into an output data symbol stream (ODSS) in which a respective number $K_n$ of data symbols ($S_{0,0}(0)$; $S_{1,0}(0)$, $S_{1,0}(1)$, $S_{,0}(2)$, $S_{1,0}(3)$; $S_{2,0}(0)$; ... $S_{N-1,0}(0)$, $S_{N-1,0}(1)$) of each data packet are sequentially arranged, comprising the following steps:

a) providing a memory means (M) having a number of columns (0, ... $Nsymbol_B-1$) and a number of rows (0 ... $N_{resource}-1$);

b) writing the data symbols of said consecutive data packets into said memory means (RAM), such that the data symbols of a data packet having the basic transmission rate $TR_B$ are consecutively arranged in one row and the data symbols of data packets having an integer multiple $TR_n=K_n*TR_B$ of the basic transmission rate are arranged consecutively as sets of $K_n$ consecutive data symbols in respective column portions of $K_n$ rows; and c) reading said data symbols from the memory means (RAM) sequentially in the column direction, whereby whenever all $TR_0/TR_B+TR_1/TR_B+TR_2/TR_B+ \ldots +TR_n/TR_B+ \ldots +TR_N/TR_B$ data symbols of one column have been read out in a time interval of $1/TR_B$, the reading is continued in the next column at the first row position, in order to provide said output data symbol stream (ODSS); and including the step of providing said memory means (M) to have a number of columns (0 ... Nsymbol-1) corresponding to the number of symbols ($Nsymbol_B$) contained in a data packet of a user channel (ch0, ch2) having the basic transmission rate and has a number of rows (0 ... Nresource-1) corresponding to $TR_0/TR_B+TR_1/TR_B+TR_2/TR_B+ \ldots +TR_n/TR_B+ \ldots +TR_{N-1}/TR_B$; and wherein said writing of data symbols is performed synchronized to a frame synchronization clock such that in each frame the data symbols of one data packet of each user channel are stored in said memory (M); and wherein said reading of the data symbols from the columns of said memory (M) is performed synchronized to an external synchronization clock provided by a CDMA modulator (MOD) or globally such that the reading from a next column at the first row position starts with each external synchronization clock; and wherein said reading is performed at a clock rate of $N_{resource}*TR_B$ which is higher than said writing, where $N_{resource}$ is the number of rows of the memory and $TR_B$ is the basic transmission rate.

23. A method for converting an input data packet stream (IDPS) of consecutive data packets ($DP_{0,0}$, $DP_{1,0}$, $DP_{2,0}$ ... $DP_{N-1,0}$) each data packet including user ($US_0$, $US_1$, $US_2$, ... $US_{N-1}$) data in the form of a predetermined number ($Nsymbol_0$; $Nsymbol_1$; $Nsymbol_{N-1}$) of consecutive data symbols ($S_{0,0}(0)$, $S_{0,0}(1)$ ... $S_{0,0}(Nsymbol_0-1)$; $S_{1,0}(0)$, $S_{1,0}(1)$ ... $S_{1,0}(Nsymbol_1-1)$; $S_{2,0}(0)$, $S_{2,0}(1)$ ... $S_{2,0}(Nsymbol_2-1)$; ... $S_{N-1,0}(0)$, $S_{N-1,0}(1)$ ... $S_{N-1,0}(Nsymbol_{N-1}-1)$) from a plurality of N user channels (ch-0, ..., ch-N-1), each user channel having a predetermined transmission rate $TR_0, TR_1, TR_2, \ldots, TR_n, \ldots TR_{N-1}$, being defined as a basic transmission rate $TR_B$ or an integer multiple $TR_n=K_n*TR_B$ thereof, into an output data symbol stream (ODSS) in which a respective number $K_n$ of data symbols ($S_{0,0}(0)$; $S_{1,0}(0)$, $S_{1,0}(1)$, $S_{,0}(2)$, $S_{1,0}(3)$; $S_{2,0}(0)$; ... $S_{N-1,0}(0)$, $S_{N-1,0}(1)$) of each data packet are sequentially arranged, comprising the following steps:

a) providing a memory means (M) having a number of columns (0, ... $Nsymbol_B-1$) and a number of rows (0 ... $N_{resource}-1$);

b) writing the data symbols of said consecutive data packets into said memory means (RAM), such that the data symbols of a data packet having the basic transmission rate $TR_B$ are consecutively arranged in one row and the data symbols of data packets having an integer multiple $TR_n=K_n*TR_B$ of the basic transmission rate are arranged consecutively as sets of $K_n$ consecutive data symbols in respective column portions of $K_n$ rows; and c) reading said data symbols from the memory means (RAM) sequentially in the column direction, whereby whenever all $TR_0/TR_B+TR_1/TR_B+TR_2/TR_B+ \ldots +TR_n/TR_B+ \ldots +TR_N/TR_B$ data symbols of one column have been read out in a time interval of $1/TR_B$, the reading is continued in the next column at the first row position, in order to provide said output data symbol stream (ODSS); and wherein each data symbol consists of a predetermined number of bits and said bits are stored during said writing step together at each memory location of said memory (M).

24. A method for converting an input data packet stream (IDPS) of consecutive data packets ($DP_{0,0}$, $DP_{1,0}$, $DP_{2,0}$ ... $DP_{N-1,0}$) each data packet including user ($US_0$, $US_1$, $US_2$, ... $US_{N-1}$) data in the form of a predetermined number ($Nsymbol_0$; $Nsymbol_1$; $Nsymbol_{N-1}$) of consecutive data symbols ($S_{0,0}(0)$, $S_{0,0}(1)$ ... $S_{0,0}(Nsymbol_0-1)$; $S_{1,0}(0)$, $S_{1,0}(1)$ ... $S_{1,0}(Nsymbol_1-1)$; $S_{2,0}(0)$, $S_{2,0}(1)$ ... $S_{2,0}(Nsymbol_2-1)$; ... $S_{N-1,0}(0)$, $S_{N-1,0}(1)$ ... $S_{N-1,0}(Nsymbol_{N-1}-1)$) from a plurality of N user channels (ch-0, ..., ch-N-1), each user channel having a predetermined transmission rate $TR_0, TR_1, TR_2, \ldots, TR_n, \ldots TR_{N-1}$, being defined as a basic transmission rate $TR_B$ or an integer multiple $TR_n=K_n*TR_B$ thereof, into an output data symbol stream (ODSS) in which a respective number $K_n$ of data symbols ($S_{0,0}(0); S_{1,0}(0), S_{1,0}(1), S_{1,0}(2), S_{1,0}(3); S_{2,0}(0); \ldots S_{N-1,0}(0), S_{N-1,0}(1)$) of each data packet are sequentially arranged, comprising the following steps:

a) providing a memory means (M) having a number of columns ($0, \ldots$ Nsymbol$_B$–1) and a number of rows ($0 \ldots N_{resource}$–1);

b) writing the data symbols of said consecutive data packets into said memory means (RAM), such that the data symbols of a data packet having the basic transmission rate $TR_B$ are consecutively arranged in one row and the data symbols of data packets having an integer multiple $TR_n=K_n*TR_B$ of the basic transmission rate are arranged consecutively as sets of $K_n$ consecutive data symbols in respective column portions of $K_n$ rows; and c) reading said data symbols from the memory means (RAM) sequentially in the column direction, whereby whenever all $TR_0/TR_B+TR_1/TR_B+TR_2/TR_B+ \ldots +TR_n/TR_B+ \ldots +TR_N/TR_B$ data symbols of one column have been read out in a time interval of $1/TR_B$, the reading is continued in the next column at the first row position, in order to provide said output data symbol stream (ODSS); and wherein said input data symbol stream (IDSS) is created by the following steps:

inputting an input data bit stream (SDBS) of consecutive data bits of said consecutive data packets to a convolutional coder (CC) and outputting a convolutional encoded data bit stream (CCBS) to an interleaver (IL);

interleaving said convolutional encoded data bit stream (ICBS) in said interleaver (IL) and outputting an interleaved convolutional encoded data bit stream to an I, Q selector (QPSK); and performing an I, Q selection of bits from an interleaved convolutional encoded data bit stream in said I, Q selector and supplying the output from said I, Q selector as said input data packet stream (IDPS).

25. A method for converting an input data packet stream (IDPS) of consecutive data packets ($DP_{0,0}, DP_{1,0}, DP_{2,0} \ldots DP_{N-1,0}$) each data packet including user ($US_0, US_1, US_2, \ldots US_{N-1}$) data in the form of a predetermined number (Nsymbol$_0$; Nsymbol$_1$; Nsymbol$_{N-1}$) of consecutive data symbols ($S_{0,0}(0), S_{0,0}(1) \ldots S_{0,0}$(Nsymbol$_0$–1); $S_{1,0}(0), S_{1,0}(1) \ldots S_{1,0}$(Nsymbol$_1$–1); $S_{2,0}(0), S_{2,0}(1) \ldots S_{2,0}$(Nsymbol$_2$–1); $\ldots S_{N-1,0}(0), S_{N-1,0}(1) \ldots S_{N-1,0}$(Nsymbol$_{N-1}$–1)) from a plurality of N user channels (ch-0, $\ldots$, ch-N–1), each user channel having a predetermined transmission rate $TR_0, TR_1, TR_2, \ldots, TR_n, \ldots TR_{N-1}$, being defined as a basic transmission rate $TR_B$ or an integer multiple $TR_n=K_n*TR_B$ thereof, into an output data symbol stream (ODSS) in which a respective number $K_n$ of data symbols ($S_{0,0}(0); S_{N-1,0}(0), S_{1,0}(1), S_{1,0}(2), S_{1,0}(3); S_{2,0}(0); \ldots S_{N-1,0}(0), S_{N-1,0}(1)$) of each data packet are sequentially arranged, comprising the following steps:

a) providing a memory means (M) having a number of columns ($0, \ldots$ Nsymbol$_B$–1) and a number of rows ($0 \ldots N_{resource}$–1);

b) writing the data symbols of said consecutive data packets into said memory means (RAM), such that the data symbols of a data packet having the basic transmission rate $TR_B$ are consecutively arranged in one row and the data symbols of data packets having an integer multiple $TR_n=K_n*TR_B$ of the basic transmission rate are arranged consecutively as sets of $K_n$ consecutive data symbols in respective column portions of $K_n$ rows; and c) reading said data symbols from the memory means (RAM) sequentially in the column direction, whereby whenever all $TR_0/TR_B+TR_1/TR_B+TR_2/TR_B+ \ldots +TR_n/TR_B+ \ldots +TR_N/TR_B$ data symbols of one column have been read out in a time interval of $1/TR_B$, the reading is continued in the next column at the first row position, in order to provide said output data symbol stream (ODSS); and including the steps of receiving an input data bit stream (CCBS) of consecutive data bits of said consecutive data packets, performing an I, Q selection (QPSK), and performing an interleaving while writing and reading said data symbols into and from said memory in a specific order.

\* \* \* \* \*